(12) United States Patent
Elce et al.

(10) Patent No.: US 8,053,515 B2
(45) Date of Patent: Nov. 8, 2011

(54) DIRECTLY PHOTODEFINABLE POLYMER COMPOSITIONS AND METHODS THEREOF

(75) Inventors: Edmund Elce, Lakewood, OH (US); Andrew Bell, Lakewood, OH (US); Brian Knapp, Medina, OH (US); Hendra Ng, Highland Heights, OH (US); Larry F. Rhodes, Silver Lake, OH (US); Robert Shick, Brecksville, OH (US); Wei Zhang, Brecksville, OH (US); William DiMenna, University Heights, OH (US); Saikumar Jayaraman, Chandler, AZ (US); Jianyong Jin, Clemson, SC (US); Rajesh Raja Puthenkovilakom, Mentor, OH (US); Ramakrishna Ravikiran, Vernon Hills, IL (US); Xiaoming Wu, Strongsville, OH (US); Etsu Takeuchi, Tokyo (JP)

(73) Assignee: Promerus LLC, Brecksville, OH (US)

( * ) Notice: Subject to any disclaimer, the term of this patent is extended or adjusted under 35 U.S.C. 154(b) by 780 days.

(21) Appl. No.: 11/949,328

(22) Filed: Dec. 3, 2007

(65) Prior Publication Data

US 2008/0194740 A1 Aug. 14, 2008

Related U.S. Application Data

(60) Provisional application No. 60/873,201, filed on Dec. 6, 2006.

(51) Int. Cl.
*C08G 63/60* (2006.01)

(52) U.S. Cl. ......... 524/599; 526/258; 526/259; 526/262

(58) Field of Classification Search ............ 524/599
See application file for complete search history.

(56) References Cited

U.S. PATENT DOCUMENTS

2002/0198356 A1 12/2002 Dershem et al.
2004/0082724 A1 4/2004 Dershem et al.

OTHER PUBLICATIONS

International Search Report for PCT/US2007/086639 dated May 9, 2008.
Chinese Office Action for Chinese Application No. 200780050794.0 mailed on Mar. 7, 2011.

*Primary Examiner* — Edward Cain
(74) *Attorney, Agent, or Firm* — Turocy & Watson, LLP

(57) ABSTRACT

A polymer includes a first type of repeat unit represented by Formula I:

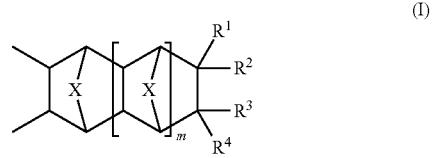

where X is selected from —$CH_2$—, —$CH_2$—$CH_2$—, or —O—; m is an integer from 0 to about 5; and where for the first type of repeat unit one of $R^1$, $R^2$, $R^3$, and $R^4$ is one of a maleimide containing group and for the second type of repeat unit one of $R^1$, $R^2$, $R^3$, and $R^4$ is a hindered aromatic group, a $C_8$ or greater alkyl group, a $C_4$ or greater halohydrocarbyl or perhalocarbyl group, a $C_7$ or greater aralkyl group, or a heteroatom hydrocarbyl or halohydrocarbyl group.

47 Claims, 6 Drawing Sheets

DIRECTLY PHOTODEFINABLE POLYMER COMPOSITIONS AND METHODS THEREOF

CROSS-REFERENCE TO RELATED APPLICATIONS

This application claims the benefit of U.S. Provisional Application Ser. No. 60/873,201 filed Dec. 6, 2006, the entire contents of which are hereby incorporated by reference.

TECHNICAL FIELD

The present invention relates generally to directly photodefinable polymers, compositions that include such polymers, methods for making such polymers and polymer compositions, the use of such compositions for forming films, layers and/or structures and the microelectronic and/or optoelectronic devices that encompass films, layers or structures formed through the use of such compositions. More specifically, the present invention is directed to photodefinable polymers and compositions thereof that encompass a polymer backbone having norbornene-type repeat units, methods of making such polymers and compositions and the use of such polymer compositions in microelectronic and optoelectronic applications.

BACKGROUND

The microelectronic and optoelectronic industries have been successful in stretching the useful life of materials and methods needed for the manufacture of micro and optoelectronic devices. However, as the complexity and the desired performance of such devices increases, such mature materials and methods are becoming more and more problematic. Therefore it would be advantageous to have new materials and methods that will meet the needs of future generations of such devices as well as to improve the yield and reduce the cost of current devices.

BRIEF DESCRIPTION OF THE DRAWING

Embodiments in accordance with the present invention are described below with reference to the following accompanying drawings.

DETAILED DESCRIPTION

Figure 1:
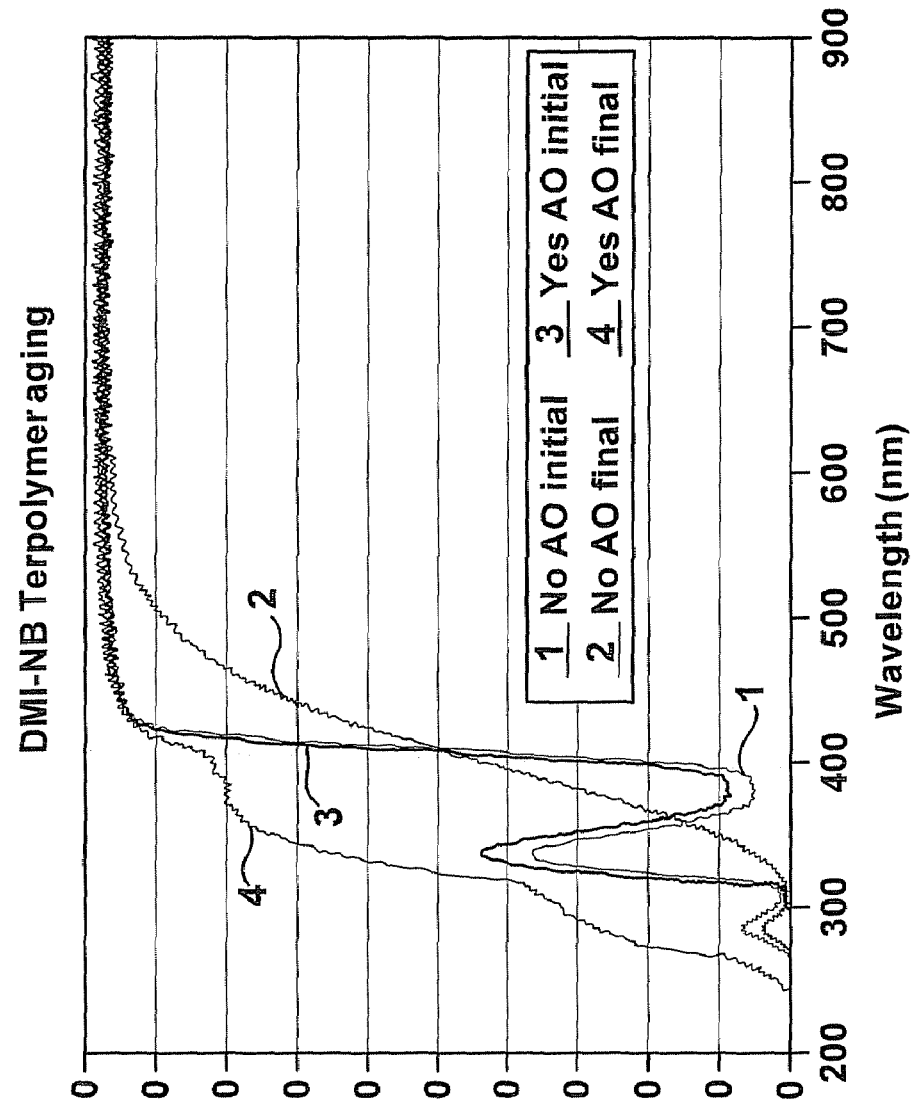
FIG. 1 is a graph of the percent transmission versus the wavelength for the polymers described in Example P2 below.

Exemplary embodiments in accordance with the present invention will be described below. As such embodiments are disclosed, various modifications, adaptations or variations of such exemplary embodiments may become apparent to those skilled in the art. For example, it might occur to such a skilled artisan that two or more polycyclic polymers or polymer compositions disclosed herein can be blended with one another in an appropriate ratio to form an advantageous polymer composition. It will be understood that all such modifications, adaptations or variations that rely upon the teachings of the present invention, and through which these teachings have advanced the art, are considered to be within the scope and spirit of the present invention.

Various numerical ranges and values are disclosed hereinbelow. Because such ranges are continuous, they include the minimum and maximum values of each range as well as every value therebetween. Further, where the ranges refer to integers, they include the minimum and maximum integer values as well as every integer therebetween. Unless expressly indicated otherwise, the various numerical ranges and values specified in this specification and in the accompanying claims, are approximations that are reflective of, among other things, the various uncertainties of measurement encountered in obtaining such values and therefore should be understood to be modified in all instances by the term "about".

As used herein, the term "polymer" means a large molecule built up from smaller molecules (monomers). Further, polymers are understood to possess a characteristic chain structure (or backbone) that consists of multiple repeat units (derived from the aforementioned monomers) that are related chemically. Still further, the term "polymer" will be understood to also encompass residues from initiators, catalysts and other elements attendant to the synthesis of such a polymer, where such residues are understood as not being covalently incorporated thereto. Further still, such residues and other elements, while normally removed during post polymerization purification processes, are typically mixed or co-mingled with the polymer such that they generally remain with the polymer when it is transferred between vessels or between solvents or dispersion media.

As used herein, the term "polymer composition" means a polymer and one or more other materials that are added to the polymer to provide, or to modify, specific properties of the polymer composition. Exemplary materials include, but are not limited to, solvents, antioxidants, photoinitiators, photosensitizers, crosslinking moieties, reactive diluents, acid scavengers, adhesion promoters, leveling agents and the like.

As defined herein, the terms "polycycloolefin", "polycyclic olefin", and "norbornene-type" are used interchangeably and refer to addition polymerizable monomers, or the resulting repeating unit, encompassing at least one norbornene moiety such as shown by either Structure A1 or A2, below:

A1

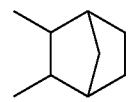

A2

The simplest norbornene-type or polycyclic olefin monomer encompassed by embodiments in accordance with the present invention is the bicyclic monomer, bicyclo[2.2.1]hept-2-ene, commonly referred to as norbornene. However, the term norbornene-type monomer or repeating unit, as used herein, will be understood to not only mean norbornene itself but also to refer to any substituted norbornene, or substituted and unsubstituted higher cyclic derivatives thereof, for example where m of Structure B, shown below, is greater than zero.

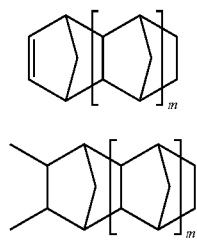

As used herein, "hydrocarbyl" refers to a radical or group that contains a carbon backbone where each carbon is appropriately substituted with one or more hydrogen atoms. The term "halohydrocarbyl" refers to a hydrocarbyl group where one or more of the hydrogen atoms, but not all, have been replaced by a halogen (F, Cl, Br, I). The term perhalocarbyl refers to a hydrocarbyl group where each hydrogen has been replaced by a halogen. Non-limiting examples of hydrocarbyls, include, but are not limited to a linear or branched ($C_1$-$C_{25}$) alkyl, a linear or branched ($C_2$-$C_{24}$) alkenyl, a linear or branched ($C_2$-$C_{24}$) alkynyl, a substituted or unsubstituted ($C_3$-$C_{25}$) cycloalkyl, a substituted or unsubstituted ($C_6$-$C_{24}$) aryl, or an ($C_7$-$C_{24}$) aralkyl. Representative alkyl groups include but are not limited to methyl, ethyl, propyl, isopropyl, butyl, isobutyl, sec-butyl, tert-butyl, pentyl, neopentyl, hexyl, heptyl, octyl, nonyl, decyl and dodecyl. Representative alkenyl groups include but are not limited to vinyl, allyl and propenyl. Representative alkynyl groups include but are not limited to ethynyl, 1-propynyl, 2-propynyl, 1 butynyl, and 2-butynyl. Representative cycloalkyl groups include but are not limited to substituted and unsubstituted cyclopropyl, cyclobutyl, cyclopentyl, cyclohexyl, and cyclooctyl. Representative aryl groups include but are not limited to phenyl, biphenyl, naphthyl, and anthracenyl. Representative aralkyl groups include but are not limited to benzyl, and phenethyl.

The term halohydrocarbyl as used throughout the present specification is inclusive of the hydrocarbyl moieties mentioned above but where there is a degree of halogenation that can range from at least one hydrogen atom being replaced by a halogen atom (e.g., a fluoromethyl group) to full halogenation (perhalogenation) wherein all hydrogen atoms on the hydrocarbyl group have been replaced by a halogen atom (e.g., trifluoromethyl or perfluoromethyl). For example, halogenated alkyl groups useful in embodiments of the present invention are partially halogenated, linear or branched alkyl groups of the formula $C_zX_{2z+1}$ wherein X is independently a halogen or a hydrogen and z is selected from an integer of 1 to 20. In some embodiments each X is independently selected from hydrogen, chlorine, fluorine bromine and/or iodine. In other embodiments each X is independently either hydrogen or fluorine.

The term perhalocarbyl as used herein is inclusive of the hydrocarbyl and halohydrocarbyl moieties described above where the degree of halogenation is complete (all hydrogen atoms being replaced with a halogen atom) and hence include perhalogenated phenyl and alkyl groups. Exemplary embodiments include, but are not limited to, perfluorophenyl, perfluoromethyl, perfluoroethyl, perfluoropropyl, perfluorobutyl and perfluorohexyl pendent groups.

In addition, references may be made herein to hydrocarbyls, halohydrocarbyls and perhalocarbyls containing one or more heteroatoms selected from O, N, P, S and Si. It will be understood that such hydrocarbyls, halohydrocarbyls and perhalocarbyls will have one or more carbons replaced by such non-carbon atoms. For example, hydrocarbyls containing one or more heteroatoms encompass groups such as ethers, epoxies, glycidyl ethers, alcohols, carboxylic acids, esters, maleimides, amines, imines, amides, phenols, amidophenols, silanes, siloxanes, phosphinates and the like. As used here and throughout the specification, amido-phenols refer to the following:

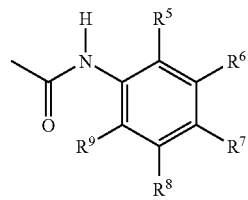

wherein $R^5$, $R^6$, $R^7$, $R^8$, and $R^9$ are as defined above with the proviso that at least one of $R^5$ to $R^9$ is —OH.

Further exemplary hydrocarbyls, halohydrocarbyls, and perhalocarbyls inclusive of heteroatoms include, but are not limited to, —$(CH_2)_n$—$CH(CF_3)_2$—O—$CH_2$—O—$CH_3$, —$(CH_2)_n$—$CH(CF_3)_2$—O—C(O)—O—C($CH_3$)$_3$, —$(CH_2)_n$—C($CF_3$)$_2$—OH, $(CH_2)_n$—C(O)NHR*, $(CH_2)_n$—C(O)Cl, —$(CH_2)_n$—C(O)OR*, $(CH_2)_n$—OR*, —$(CH_2)_n$—OC(O)R*, and —$(CH_2)_n$—C(O)R*, where n independently represents an integer from 0 to 10 and R* independently represents hydrogen, linear or branched ($C_1$-$C_{11}$) alkyl, linear or branched $C_1$-$C_{11}$ halogenated or perhalogenated alkyl, linear or branched ($C_2$-$C_{10}$) alkenyl, linear or branched ($C_2$-$C_{10}$) alkynyl, ($C_5$-$C_{12}$) cycloalkyl, ($C_6$-$C_{14}$) halogenated or perhalogenated aryl, and ($C_7$-$C_{24}$) aralkyl. Representative hydrocarbyl groups set forth under the definition of R* are the same as those identified above and as above can be halogenated or perhalogenated with the proviso that such groups are not acid labile. For example, when R* is $C_1$-$C_{11}$ halogenated or perhalogenated alkyl, R* can be represented by the formula $C_zX_{2z+1}$, wherein z is an integer from 1 to 11, at least one X on the alkyl group is a halogen, the remaining being independently a hydrogen or a halogen. Examples of perhalogenated alkyl groups include, but are not limited to, trifluoromethyl, trichloromethyl, —$C_7F_{15}$, and —$C_{11}F_{23}$. Examples of perhalogenated aryl groups include, but are not limited to, pentachlorophenyl and pentafluorophenyl.

Polymers

The polymer embodiments in accordance with the present invention advantageously incorporate two or more distinct types of repeating units, where at least one such type of repeating unit encompasses pendent crosslinkable groups or moieties that have some degree of latency. By latency, it is meant that such groups do not crosslink at ambient conditions or during the initial forming of the polymers, but rather crosslink when such reactions are specifically initiated, for example by actinic radiation. Such latent crosslinkable groups are incorporated into the polymer backbone by, for example, providing one or more norbornene-type monomers encompassing a pendent crosslinkable group, such as a maleimide containing pendent group, to the polymerization reaction mixture and causing the 2,3-enchainment of such norbornene-type monomer(s). Generally speaking, the second type of repeat unit may be one encompassing a pendent hindered aromatic group, $C_8$ or greater alkyl group, $C_4$ or greater halohydrocarbyl or perhalocarbyl group, $C_7$ or greater aralkyl group, or heteroatom hydrocarbyl or halohydrocarbyl group (excluding epoxy groups). Third, forth, fifth, and/or sixth (and so on) types of repeat units may also be incorporated into polymer embodiments of the invention.

These distinct types of repeating units are independently represented by Formula A:

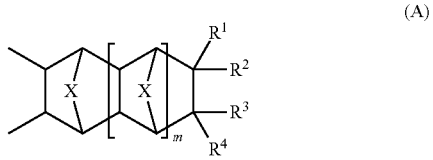

(A)

where X is selected from —$CH_2$—, —$CH_2$—$CH_2$—, or —O—; m is an integer from 0 to 5; and where for the first type of repeating unit, at least one of $R^1$, $R^2$, $R^3$, and $R^4$ is a maleimide containing pendent group represented by Formula B, shown below, and the others of $R^1$, $R^2$, $R^3$, and $R^4$ are each independently selected from H, a hydrocarbyl, a halohydrocarbyl, a perhalocarbyl or such moieties having one or more heteroatoms as described above.

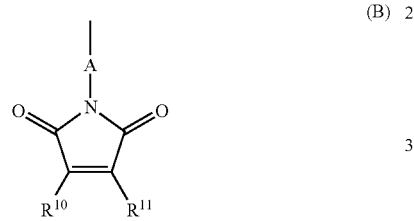

(B)

where A is a linking group selected from methylene, a linear or branched $C_2$ to $C_6$ hydrocarbyl, halohydrocarbyl or perhalocarbyl, or a substituted or unsubstituted $C_5$ to $C_{12}$ cyclic or polycyclic hydrocarbyl, halohydrocarbyl or perhalocarbyl or $C_7$ or greater alkyl or aralkyl, and $R^{10}$ and $R^{11}$ are each independently selected from H, methyl, ethyl, or n-propyl.

Figure 2:
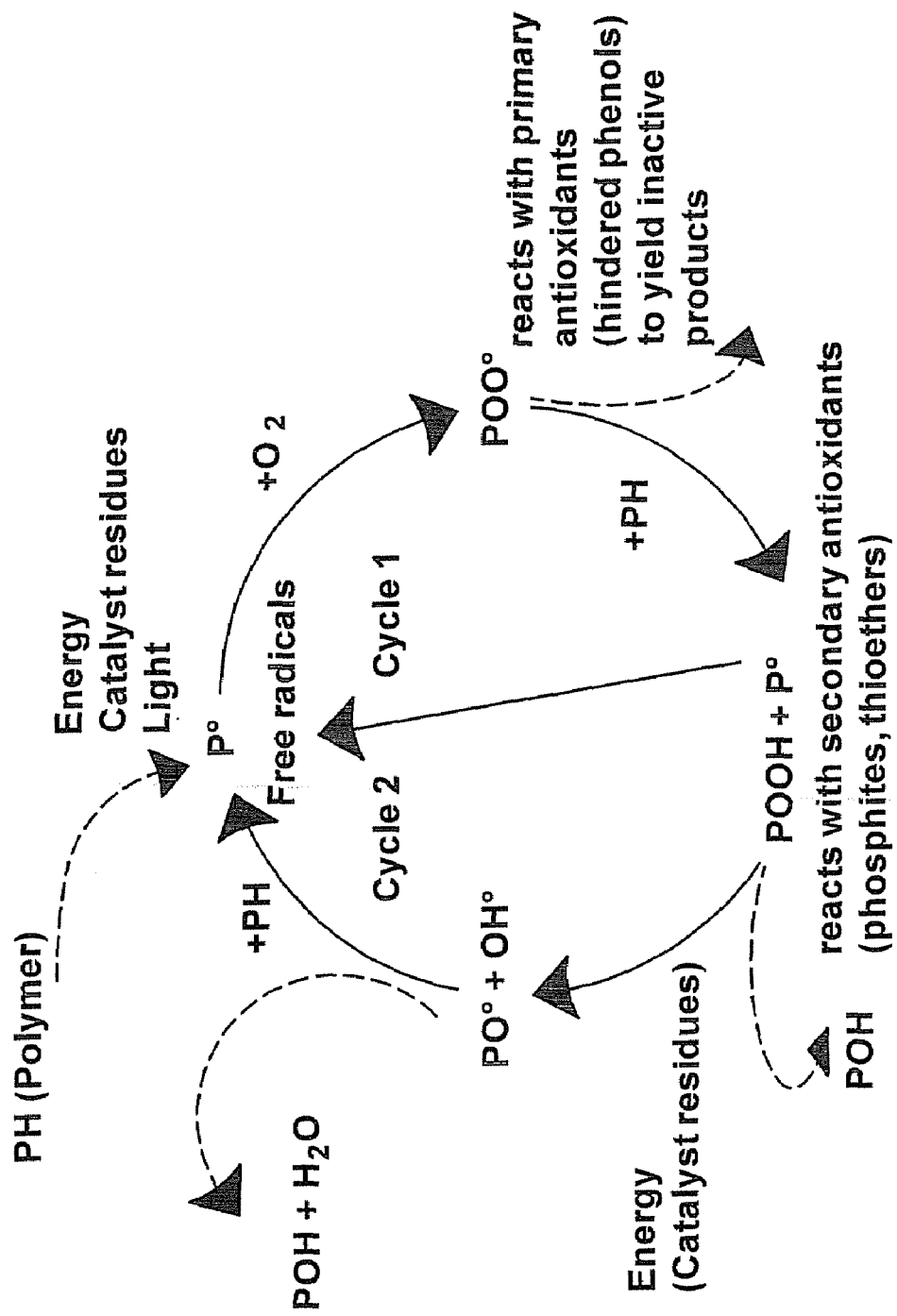
FIG. 2 depicts a possible mechanism for one aspect of the function of the hindered functional aromatic pendent group within a norbornene-type polymer.

In some embodiments, the pendent group of a second type of norbornene-type repeating unit is a hindered functional aromatic group. In some instances, the presence of a norbornene-type monomer with a hindered functional aromatic pendent group improves/increases the thermo-oxidative stability of polymers containing these repeating units. The norbornene-type repeating units with a hindered functional aromatic pendent group contribute to overcoming challenges associated with the unfortunate thermal volatility of additive anti-oxidant compounds. Chemically bonding the hindered functional aromatic group such as a hindered phenol group to the polymer backbone eliminates the issue of loss of protection as a result of volatilization of an added, discrete anti-oxidant compound. Although not wishing to be bound by any theory, it is believed that the hindered functional aromatic pendent group disrupts the oxidation cycle of aliphatic compounds and polymers. FIG. 2 describes what is believed to be the stabilization mechanism of polymer embodiments in accordance with the present invention. That is to say such figure depicts how a pendent hindered functional aromatic group included within such a polymer acts to provide thermo-oxidative stability in excess of what would be found if such group were not present. Thus as shown in FIG. 2, hindered functional aromatic pendent groups provide an anti-oxidation benefit by reacting with any hydroperoxyl radicals that are formed during the initial stages of oxidation.

Repeating units containing a hindered functional aromatic pendent group are also represented by Formula A, above, but where at least one of $R^1$, $R^2$, $R^3$, and $R^4$ is a hindered functional aromatic pendent group represented by Formula D, shown below, and the others of $R^1$, $R^2$, $R^3$, and $R^4$ are each independently selected from H, a hydrocarbyl, a halohydrocarbyl or a perhalocarbyl or such moieties having one or more heteroatoms as described above.

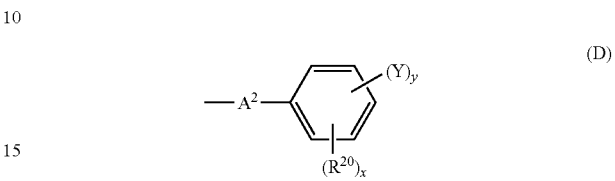

(D)

where $A^2$ is a linking group selected from methylene, a linear or branched $C_2$ to $C_6$ hydrocarbyl, halohydrocarbyl or perhalocarbyl, or a substituted or unsubstituted $C_5$ to $C_{12}$ cyclic or polycyclic hydrocarbyl, halohydrocarbyl or perhalocarbyl, $C_1$ to $C_{12}$ ester, $C_1$ to $C_{12}$ amide, $C_1$ to $C_{12}$ sulfide, $C_1$ to $C_{12}$ ether or a combination thereof; each Y is independently a functional group such as OH and SH; y is an integer from 1 to about 3; each $R^{20}$ is independently a $C_1$ to $C_{12}$ alkyl (straight or branched) or cycloalkyl group (substituted or unsubstituted); and x is an integer from 1 to about 4. In another embodiment, y is 1 and x is 2.

Generally speaking, a hindered aromatic anti-oxidant contains a phenolic —OH functional group that is sterically shielded by at least one substituent on the aromatic ring. For example, substitution of the one or both of the carbon atoms, such as carbon atoms alpha to the phenolic C, provides steric shielding. The steric bulk of the substituents substantially lowers the reactivity of the oxygen radical, preventing further degradation of a polymer by this reactive radical species.

Specific examples of $R^{20}$ groups include methyl, ethyl, n-propyl, isopropyl, n-butyl, isobutyl, t-butyl, n-pentyl, amylpentyl, cyclopentyl, substituted cyclopentyl, hexyl, cyclohexyl, substituted cyclohexyl, and the like, some of which are shown by structures below.

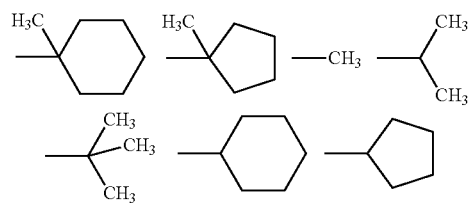

An example of a norbornene-type monomer with a hindered functional aromatic group is represented by Formula E

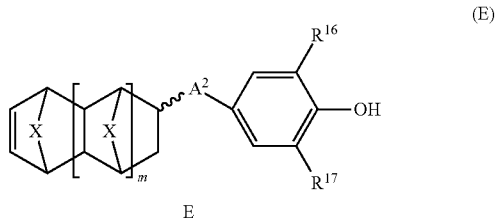

(E)

where X is selected from —CH$_2$—, —CH$_2$—CH$_2$—, or —O—; m is an integer from 0 to 3; A$^2$ is a linking group selected from methylene, a linear or branched C$_2$ to C$_6$ hydrocarbyl, halohydrocarbyl or perhalocarbyl, or a substituted or unsubstituted C$_5$ to C$_{12}$ cyclic or polycyclic hydrocarbyl, halohydrocarbyl or perhalocarbyl, C$_2$ to C$_{12}$ ester, C$_1$ to C$_{12}$ amide, C$_1$ to Cl$_2$ sulfide, or a combination thereof; n is an integer from 0 to about 5; and each of R$^{16}$ and R$^{17}$ is independently a C$_1$ to C$_{10}$ alkyl (straight or branched) or cycloalkyl group (substituted or unsubstituted).

Yet another example of a norbornene-type monomer with a hindered functional aromatic group is represented by Formula F.

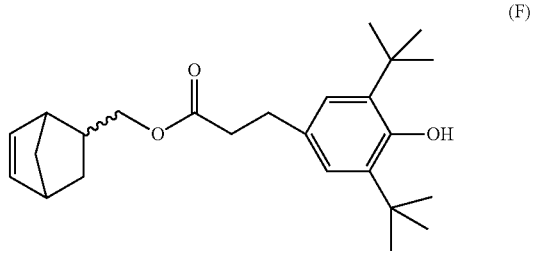

(F)

Advantageously, for some polymer composition embodiments encompassing repeating units having such a hindered functional aromatic pendent group, antioxidant additives are not provided. That is to say, such compositions do not contain non-polymer bound antioxidants and any loss of such additives, as discussed above, is avoided.

As mentioned above, embodiments in accordance with the present invention can incorporate a plurality of types of repeat units in addition to the aforementioned first type of repeat unit. For example, in addition to a second type of repeating unit having a hindered functional aromatic pendent group as described above, other second types of repeat units can be incorporated into polymers of in accordance with the present invention that are also represented by the aforementioned Structure A where none of R$^1$ to R$^4$ is a maleimide group or a hindered functional aromatic group, but rather is selected from a linear or branched C$_1$ to C$_{25}$ hydrocarbyl, halohydrocarbyl or perhalocarbyl, where such hydrocarbyl, halohydrocarbyl or perhalocarbyl comprises one or more heteroatoms selected from O, N, S, P and Si, or a linear or branched C$_1$ to C$_{25}$ hydrocarbyl, halohydrocarbyl, or perhalocarbyl and the others of R$^1$ to R$^4$ are H. In some embodiments, X is —CH$_2$—; m is 0; and at least one of R$^1$ to R$^4$ is selected from a C$_7$ or greater aralkyl group, or a C$_8$ or greater alkyl group, or a C$_4$ or greater halohydrocarbyl or perhalocarbyl group or a heteroatom hydrocarbyl or halohydrocarbyl group, with the proviso that the heteroatom hydrocarbyl or halohydrocarbyl group is not an epoxy. In yet other embodiments, at least one of R$^1$ to R$^4$ is a C$_1$ to C$_{25}$ halohydrocarbyl compound containing a hydroxyl group such as —(CH$_2$)$_p$—C(CF$_3$)$_2$OH or —(CH2)p—O—CH2—C(CF3)2OH where p is an integer from 0 to about 5. Advantageously, such a pendent group can in some instances contribute antioxidant properties to the resultant polymer.

In still further polymer embodiments in accordance with the present invention one or more other repeat units based on Structure A can be included into the polymer where at least one of R$^1$ to R$^4$ is selected from a linear or branched C$_1$ to C$_{25}$ hydrocarbyl, halohydrocarbyl or perhalocarbyl, where such hydrocarbyl, halohydrocarbyl or perhalocarbyl encompasses one or more heteroatoms selected from O, N, S, P and Si, or a linear or branched C$_1$ to C$_{25}$ hydrocarbyl, halohydrocarbyl, or perhalocarbyl and the others of R$^1$ to R$^4$ are H, with the proviso that said other types of repeat unit are distinct from any other type of repeat unit.

For some embodiments in accordance with the present invention, it is advantageous to control the refractive index (RI) of a norbornene-type polymer. Such control can be had by changing the nature or type of one or more of the pendent groups provided to repeating units of the polymer. Thus repeating units that contain pendent groups having aromatic, Br or Cl moieties will generally provide for a polymer having a higher RI than a polymer that has repeating units that contain pendent groups having alkyl, Si, F and/or ether moieties. In addition, where more than one type of monomer is used to form a polymer, if the feed ratio of the monomers is altered during the polymerization, the relative amounts of specific monomers incorporated into the resulting polymer can be changed. It will be understood that such a change in the relative amounts of monomers can change the RI of that polymer in relation to a polymer formed from the same monomers, but with differing amounts of incorporation into the resulting polymer.

Yet other exemplary norbornene functional monomers represented by Formula A include those where one of R$^1$ to R$^4$ is one of groups AA, BB, CC, DD, EE or FF and the others are each generally hydrogen:

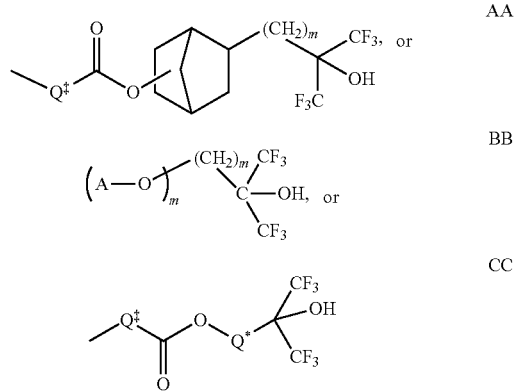

where m and Q‡ are as defined above and Q* is a linear or branched alkyl spacer of 1 to 5 carbons and A is as defined for Formula B, above. In some embodiments encompassing groups AA or CC, Q‡ is not present or is a linear alkyl spacer of 1 to 3 carbons. Additionally, for group CC, Q* can be a linear or branched spacer of 3 or 4 carbons. In other such embodiments, Q‡ is not present or is 1 carbon atom. In other embodiments encompassing group BB, m is either 1 or 2. In some exemplary embodiments of the present invention X is —CH$_2$—, one of R$^1$ to R$^4$ is group BB while the others are each hydrogen, n is 0 and m is 1,

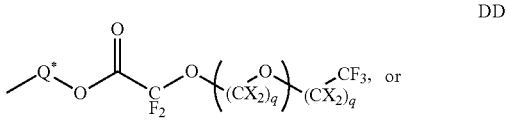

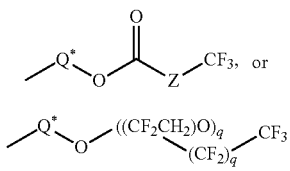

where each X is independently either fluorine or hydrogen, each q is independently an integer from 1 to 3, p is an integer from 1 to 5, Q* is as defined above, and Z is a linear or branched halo or perhalo spacer of 2 to 10 carbons. In some embodiments encompassing group DD, Q* is a single carbon spacer, X is fluorine, q is 2 or 3 and p is 2. In some embodiments encompassing group EE, Q* is a single carbon spacer and Z is a branched fluorinated alkyl chain of up to 9 carbons units. In some embodiments encompassing group FF, Q* is a single carbon spacer and q is 1 or 2.

In embodiments of the present invention that encompass a repeating unit having a hindered functional aromatic group, an optional norbornene-type repeating unit having a pendent antioxidant stabilizer group can be provided. In some instances, such an optional repeating unit can enhance the activity of the hindered functional aromatic group of the repeating units having such a hindered functional aromatic group. An example of such an optional norbornene-type repeating unit with an antioxidant stabilizer pendent group is a phosphinate represented by Structure H below:

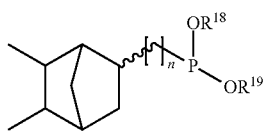

where n is an integer from 1 to about 5; and each of $R^{18}$ and $R^{19}$ are independently selected from a $C_1$ to $C_{25}$ hydrocarbyl group. In another embodiment, each of $R^{18}$ and $R^{19}$ are independently selected from a $C_6$ to $C_{20}$ optionally substituted aromatic group. In yet another embodiment, each of $R^{18}$ and $R^{19}$ are independently represented by Structure I below:

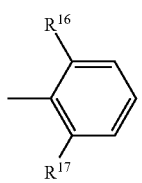

where each of $R^{13}$ and $R^{19}$ are independently a $C_1$ to $C_{12}$ alkyl (straight or branched) or cycloalkyl group (substituted or unsubstituted). Specific examples of $R^{18}$ and $R^{19}$ groups include methyl, ethyl, n-propyl, isopropyl, n-butyl, isobutyl, t-butyl, n-pentyl, amyl-pentyl, cyclopentyl, substituted cyclopentyl, hexyl, cyclohexyl, substituted cyclohexyl, and the like.

In yet other polymer embodiments in accordance with the present invention, a repeating unit is derived from of a norbornene-type monomer having a silicon containing pendent group. Referring to Formula A, at least one of $R^1$, $R^2$, $R^3$, and $R^4$ us such a repeating unit is a silicon containing group. In some such embodiments of the present invention, the pendent group of norbornene-type repeating unit can incorporate multiple silicon atoms and can be derived from, but is not limited to, one of the exemplary polyhedral oligomeric silsesquioxane or POSS group norbornene monomers (available from Hybrid Plastics of Hattiesburg, Miss.) designated as 1020NB, 1021NB, 1022NB, 1034NB, 1035NB and 1038NB, respectively are shown below. Such POSS norbornene monomers have higher silicon content than the other silyl containing repeating units such as Si heteroatom containing hydrocarbyls, halohydrocarbyls and the like.

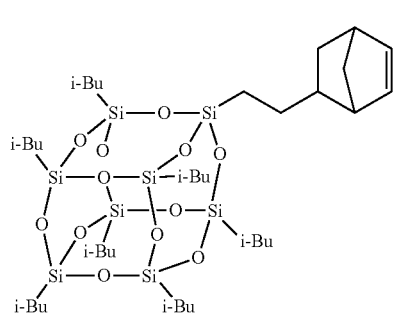

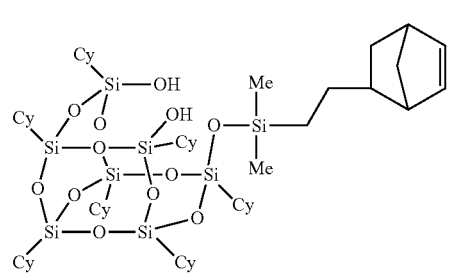

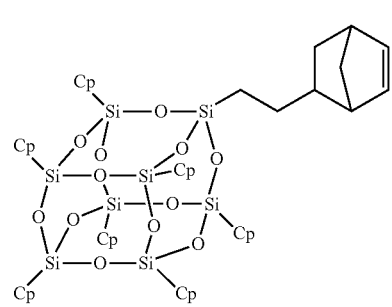

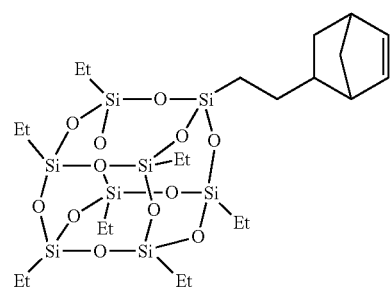

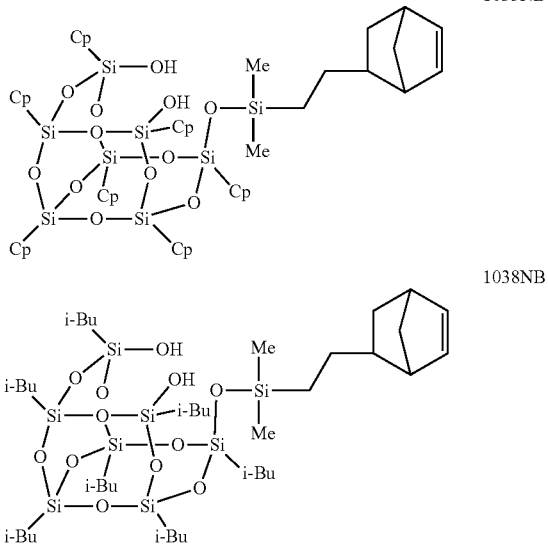

where Cp is cyclopentyl, i-Bu is iso-butyl, Et is ethyl, Cy is cyclohexyl and Me is methyl.

The POSS monomers and polymers containing repeating units derived therefrom are believed to have a relatively rigid, thermally stable silicon-oxygen framework. In some instances, the use of such POSS monomers in the forming of polymers in accordance with the present invention results in polymers having advantageous properties. For example, a relatively low refractive index and dielectric constant, and relatively high glass transition temperatures (Tg), reduced moisture absorption and increased resistance to plasma etching conditions (for example as might be found in the manufacture of microelectronic devices), as compared to analogous polymers without such high silicon content repeat units.

Polymer embodiments in accordance with the present invention can be prepared by addition polymerization of monomers in the presence of a single or multi-component Group VIII transition metal catalyst performed in an appropriate solvent. Exemplary polymerization processes are described in published U.S. Patent Publication No. 20060020068 A1 at paragraphs [0053] and [0057], such paragraphs, and the documents referenced therein, are herein incorporated by reference. Other exemplary polymerization processes are described in U.S. Pat. No. 5,468,819 and U.S. Patent Publication No. 20070066775, also incorporated herein by reference. Generally, the polymer compositions of the present invention are not prepared by ring opening metathesis polymerization.

The polymer embodiments of the present invention can be first deposited onto a desired substrate as a coating from a polymer composition formed by combining a polymer with a solvent to form a solution. Thus polymers can be cast from such compositions as films using methods known to those skilled in the art or by methods that will become so known, such as spin coating, dip coating, brush coating, roller coating, spray coating, solution casting, curtain coating, meniscus coating, ink-jet printing (where the polymer composition is the "ink"), and the like. Generally, spin coating is used due to its simplicity and the high uniformity of the resulting films.

Where spin coating is employed, generally a polymer is first purified to remove the previously described residues. Next the purified polymer and any desired additives are provided with an appropriate casting solvent. Suitable solvents include hydrocarbon solvents, aromatic solvents, cycloaliphatic cyclic ethers, cyclic ethers, acetates, esters, lactones, ketones, amides, cyclic carbonates, or mixtures thereof. Examples of solvents include organic solvents such as cyclohexanone, 2-heptanone, toluene, xylene, mesitylene, and decalin cyclohexane, benzene, tetrahydrofuran, anisole, or terpenoids. In some embodiments in accordance with the present invention, the polymer solution has a solids content from 2 to 65 wt % in solvent. In other embodiments, the solids content ranges from 15 to 45 wt %. Solution viscosities generally range from 100 to 50,000 centipoise (cp) and are generally selected to provide a desired deposited thickness for the polymer that will be employed. The photoinitiator and additives, such as photosensitizers, storage stabilizers, adhesion promoters and the like, are typically added to the polymer solution at this point to complete the forming of the polymer composition.

The polymer is then spin coated or cast onto a substrate from the aforementioned composition at suitable spin speeds. In one embodiment, the spin speed ranges from 200 to 5,000 revolutions per minute (rpm) for periods ranging from 20 to 200 seconds. The spin coating is generally performed in a two-act process in which a slower spin speed of 500 rpm for 10 seconds is initially utilized, followed by a higher spin speed of 800 rpm to 3500 rpm for 20 to 60 seconds. Generally, the films have a thickness from 0.1 to 50 microns, although thicker films, up to 500 microns, are possible when employing other coating techniques. After the spin coating process is completed, generally the spun-on film is heated to an elevated temperature to remove essentially all of any residual solvents or other volatiles therefrom. For example, in some embodiments of the present invention, a spun film can be heated from 70° C. to 130° C. for from 1 to 30 minutes.

The resulting polymer layer can then be imagewise exposed by electron beam or electromagnetic (actinic) radiation such as x-ray, ultraviolet or visible radiation. For example, actinic radiation may be employed to image the polymer using a wavelength of from 11 nm to 700 nm, such as from 200 to 700 nm. A dose of actinic radiation for exposure is generally from 25 to 3,000 mJ/cm². Suitable radiation sources include mercury, mercury/xenon, mercury/halogen and xenon lamps, argon or xenon laser sources, x-ray or e-beam. Such exposure to actinic radiation is to cause crosslinking in exposed regions. Although other repeating unit pendent groups that crosslink can be provided generally such crosslinking is provided, in significant part, by repeating units that encompass a maleimide pendent group. If it is desired to use a light source having a wavelength outside of the photo-absorption band of the maleimide group, a radiation sensitive photosensitizer can be added.

If desired, the film can be optionally post exposure baked at a temperature from 70° C. to 130° C. for a period of from 1 to 10 minutes. Post exposure bake can be used to further promote crosslinking of other crosslinkable moieties within exposed portions of the photodefinable polymer, where the increased temperature of such bake serves further the degree of crosslinking within such exposed areas.

The pattern in the polymer layer or film is then developed by removing the unexposed regions of the film either by immersion, puddling or spraying with a suitable solvent onto the layer for a time sufficient to provide the desired pattern. Generally such time is a short period of time, 1 to 5 minutes. Suitable developers include but are not limited to toluene, xylene, mesitylene, decalin, cyclopentanone, 2-heptanone, and limonene.

Generally after the pattern is developed, the patterned layer is heated to a temperature of from 90° C. to 250° C. for a suitable period of time, typically less than 3 hours, to remove any residual solvents as may be present Alternatively or additionally after development, optionally post develop baking and subsequent curing, where such curing is employed to bond a coated substrate to another substrate may be employed. In one embodiment, curing involves heating the developed polymer to a temperature from 150° C. to 290° C. for a period of time between from about 30 to about 180 minutes.

The polymers made in accordance with the invention have at least a first type of repeat unit, which is derived from a norbornene-type monomer with a maleimide pendent group and a second type of repeat unit, which is derived from a norbornene-type monomer having one of a hindered functional aromatic pendent group, a $C_7$ or greater aralkyl group, or a $C_8$ or greater alkyl group, or a $C_4$ or greater halohydrocarbyl or perhalocarbyl group or a heteroatom hydrocarbyl or halohydrocarbyl group, with the proviso that the heteroatom hydrocarbyl or halohydrocarbyl group is not an epoxy. The polymers made in accordance with the invention optionally can have one or more other types of repeat units that are distinct from the first or second type of repeating units employed.

In some embodiments, a polymer made as described herein contains from 1 to 70 mole percent of the first type of repeat unit, from 0 to 80 mole percent of the second type of repeat unit, and from 0 to 60 mole percent of a third type of repeat unit. In other embodiments, a polymer made as described herein contains from 10 to 50 mole percent of the first type of repeat unit, from 5 to 60 mole percent of the second type of repeat unit, and from 10 to 50 mole percent of the third type of repeat unit. In yet another embodiment, a polymer made as described herein contains from 15 to 45 mole percent of the first types of repeat unit, from 10 to 50 mole percent of the second types of repeat unit, and from 20 to 40 mole percent of the third types of repeat unit. In other embodiments, a polymer made as described herein contains from 5 to 50 mole percent of the first types of repeat unit; or from 25 to 35 mole percent of the first types of repeat unit from 65 to 75 mole percent of the second types of repeat unit; or from 25 to 35 mole percent of the first types of repeat unit from 35 to 45 mole percent of the second types of repeat unit.

In another embodiment, the first type of repeat unit is derived from a norbornene-type monomer having a maleimide containing pendent group, a second type of repeat unit derived from a norbornene-type monomer having an aralkyl pendent group, and a third type of repeat unit derived from a norbornene-type monomer having a linear alkyl pendent group. In such an embodiment, the first type of repeat unit and the third type of repeat unit are each from 25 to 35 percent of a total number of repeat units in the polymer and the second type of repeat unit is from 35 to 45 percent of such total.

Polymers described herein have a suitable weight average molecular weight (Mw) to function as one of a photodefinable polymer or a dielectric material. In one embodiment, the polymer has a Mw from 10,000 to 500,000. For some embodiments, it is advantageous for the polymer to have a Mw from at least 30,000, while in others from at least 60,000. In some embodiments, the upper range of the polymer's Mw is up to 400,000, while in others is up to 250,000. Mw is determined by gel permeation chromatography (GPC) using poly(styrene) standards. The Mw desired and/or selected of a polymer is selected to be sufficient to provide the desired physical properties in the cured polymer, films, layers or structures derived therefrom.

Layer and structures formed from the polymer embodiments in accordance with the present invention can be made to have any suitable thickness that is appropriate for the particular end-use of such layer or structure. In some embodiments, a thickness from 0.01 to 1,000 microns is appropriate. In other embodiments, a thickness from 0.1 to 100 microns is appropriate.

The layers and structures formed from the polymer embodiments in accordance with the present invention advantageously have a relatively low modulus. In some embodiments, such layer or structure has a modulus from 0.05 GPa to 4 GPa. In other embodiments, a modulus from 0.1 GPa to 3 GPa can be provided.

Advantageously the layers and structures formed from the polymer embodiments in accordance with the present invention have a relatively low moisture absorption and/or low dielectric constant. In some embodiments, moisture absorption of less than 2 weight percent and/or a dielectric constant of less than 3.9 are found. In other embodiments, moisture absorption of less than 1 weight percent and/or a dielectric constant of less than about 2.5 are found. Moisture absorption is determined by measuring weight gain of a sample in accordance with ASTM D570-98.

The cured layers or structures formed from the polymer embodiments in accordance with the present invention generally have a relatively high glass transition temperature (Tg). In some embodiments, such layers or structures have a Tg of at least 200° C. In other embodiments at least 250° C., and in still others, 300° C. The relatively high Tg allows for the use of such layers or structures in a wide variety of microelectronic or optoelectronic applications and devices. Tg is determined using Dynamic Mechanical Analysis (DMA) on a Rheometric Scientific Dynamic Analyzer Model RDAII available from TA Instruments, New Castle, Del. according to ASTM D5026-95 (temperature: ambient to 400° C. at a rate of 5° C. per minute).

The polymer embodiments of the present invention that encompass a norbornene-type repeating unit having a maleimide pendent group and at least a second type of repeat unit such as has been previously described, can be employed to make photodefinable polymer compositions. Photodefinable polymer compositions typically encompass one or more solvents, sensitizer components, catalyst scavengers, adhesion promoters, antioxidants, fire retardants, stabilizers, reactive diluents, or plasticizers. Exemplary sensitizer components include, among others, anthracenes, phenanthrenes, chrysenes, benzopyrenes, fluoranthenes, rubrenes, pyrenes, xanthones, indanthrenes, thioxanthen-9-ones, or mixtures thereof. Exemplary catalyst scavengers include, among others, phenothiazine, 9H-carbazole and N,N-dimethyl aniline. Exemplary antioxidants include, but are not limited to Irganox 1076, Irganox 1010 (both from Ciba Chemicals), Lowinox WSP, Lowinox 1790, Anox 330, Anox 20 and Lowinox CA22 (all from Great Lakes Chemical Co.). Exemplary flame retardants are, among others, aluminum hydroxide, magnesium hydroxide, polyhalogenated biphenyls and organophosphates. Exemplary adhesion promoters include, but are not limited to 3,3'-bis(triethoxysilylpropyl) disulfide, 3-aminopropyl triethoxysilane, 3-aminopropyl trimethoxysilane and 3-(glycidylmethyloxy)propyl trimethoxy silane. Exemplary reactive diluents encompass, among others, 1,4-cyclohexane dimethanol divinyl ether, 1,4-butanediol divinyl ether, 1-(ethenyloxy)-4-(2-propynyloxy)-butane and 1,6-bis(ethenyloxy)-hexane. Exemplary plasticizers are, among others, polystyrene, poly(α-methylstyrene), poly(alkyl norbornene) homo-polymers and copolymers.

Photodefinable polymer composition embodiments in accordance with the present invention are useful as components of electrical and/or electronic devices, for making electrical and/or electronic devices, as well as a variety of optoelectronic devices that can benefit from the high temperature stability and/or other properties of the polymers therein. Examples of electrical and/or microelectronic devices include semiconductor devices, logic chips such as microprocessor chips, passive devices, a memory chips, microelectromechanical system (MEMS) chips, a microoptoelectromechanical system (MOEMS) chips, application specific integrated circuit (ASIC) chips, optoelectronic devices such as display devices, light emitting diodes, and plasma devices.

Figure 6:
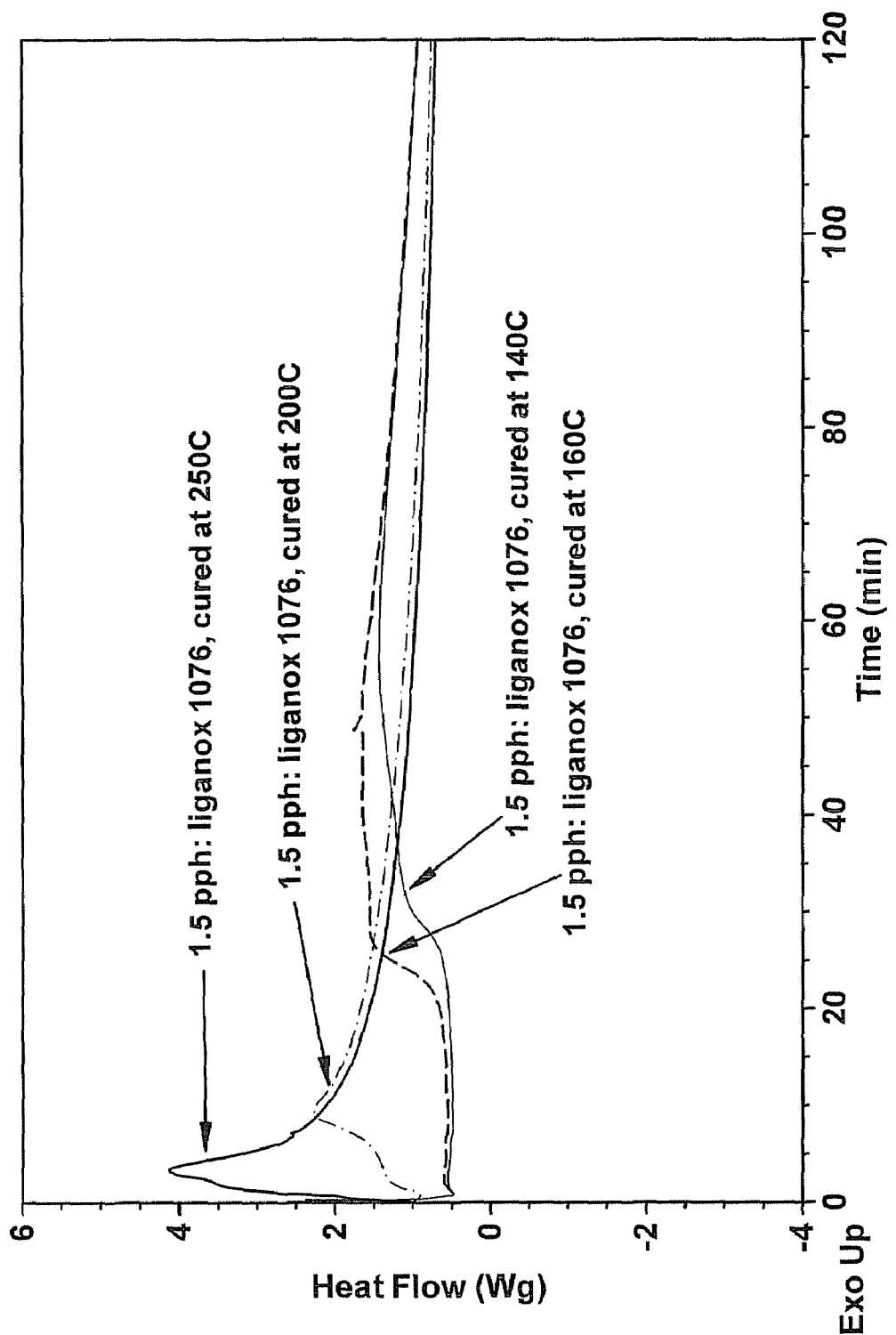
FIG. 6 is a graph illustrating the difference in the oxidation induction time for four samples of a polymer composition, each sample having a different cure temperature as indicated.

Polymers that are substantially formed from hydrocarbyls are generally susceptible to oxidation when exposed to air, especially at elevated temperatures. Obviously such oxidation would lead to a degradation in desirable mechanical properties, such as elongation to break (ETB) among others. To overcome such a deficiency, anti-oxidative additives have generally been included in polymer compositions. However, "Oxidation Induction Time" (OIT) measurements performed on layers and structures formed from such polymers revealed that substantial amounts of antioxidant additives (non-polymer bound) are required to obtain even small amounts of thermo-oxidative resistance. Furthermore, it was found that significant loss of such additives could occur where the temperature of the thermal cure used to drive the crosslinking reaction to completion is high since it was observed that increasing the cure temperature employed resulted in a decrease in the onset of the measured OIT (see, FIG. 6).

However, where a polymer of an embodiment in accordance with the present invention includes norbornene-type repeating units having a pendent group of one of a hindered functional aromatic group, excellent thermo-oxidative stability was observed and such result attributed to the antioxidant properties of such pendent groups. Moreover, since the hindered functional aromatic group is bound to the polymer backbone, it is not subject to the negative characteristics of conventional antioxidant additives. In one embodiment, polymers made using a norbornene-type monomer having a pendent group of a hindered functional aromatic group have thermo-oxidative stability where no significant change in mechanical properties is detected after a 50 hour exposure to air at 165° C. In another embodiment, polymers made using a norbornene-type monomer having a pendent group of a hindered functional aromatic group have thermo-oxidative stability where no significant change in mechanical properties is detected after a 100 hour exposure to air at 165° C. In other words, the invention describes methods of providing improved thermo-oxidative stability to polynorbornene polymers.

MONOMER SYNTHESIS EXAMPLES

The following synthesis examples demonstrate the forming of norbornene-type monomers useful for preparation of the polymers of the invention that can be useful as directly photodefinable materials. Unless otherwise indicated in the following examples and elsewhere in the specification and claims, all parts and percentages are by weight, all temperatures are in degrees Centigrade, and pressure is at or near atmospheric pressure.

Example M1

Dimethyl Maleimide-Methylene (C1) Spaced

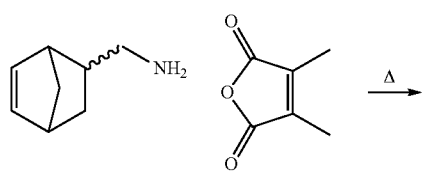

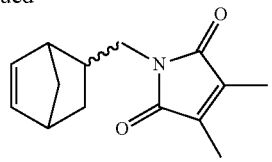

Exo/eEndo-N—NBCH2-2,3-dimethylmaleimide. A solution of dimethyl maleic anhydride (679.6 g, 5.39 mol) in 6000 ml toluene was prepared in a 12-L flask fitted with a mechanical stirrer, Dean-Stark trap, condenser, and thermocouple. The mixture cooled to 16.2° C. as the di-methylmaleic anhydride dissolved in the toluene. To the mechanically stirred mixture was added 663.4 g of 99% aminomethylnorbornene (75PAL36, 5.4 mol) and 600 ml toluene rinse. The mixture immediately set up and exhibited an exotherm to 33.8° C. The mixture was heated carefully (to avoid excessive foaming) to reflux. At 109° C., approximately 1.5 hrs from the start of heat-up, the solution cleared and 98 ml water (>100% of theoretical) was collected in the trap. GC analysis revealed the reaction was complete. The mixture was cooled to room temperature, filtered, and rotary evaporated to yield 1655.5 g (>100%) of a light brown liquid, 98.9% pure (GC). To this was added 128.2 g remaining from a previous batch of crude material and the combined was vacuum distilled to give 281.3 g, 99.4% purity, at 146.3-148.9° C. (0.8-1.2 Torr) and 920.1 g, 99.8% purity, at 149° C. (1.2-1.6 Torr). A forerun of 132.1 g was collected, giving 96.8% purity product, but containing unreacted dimethylmaleic anhydride. Overall yield of >99% purity product was 1201.4 g for 87% yield.

Example M2

Unsubstituted Maleimide; Ethylene—C2 Spaced

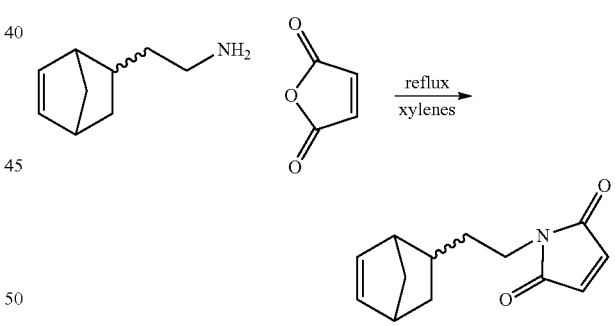

Endo-/exo-N—NBCH$_2$CH$_2$maleimide (endo/exo-MIENB). Maleic anhydride (388.62 g, 3.96 mol) was ground in a mortar and then mixed with 6300 ml xylenes, causing the temperature to drop to 19° C., while yielding a hazy solution. Amino-ethylnorbornene (90.1% purity, 600 g, 3.9 mol) was added dropwise over a 20-minute period to the stirred mixture, causing the temperature to rise to 49.3° C. and giving a deep amber solution. The mixture was refluxed into a Dean-Stark trap for 5 hours 40 minutes when water take-off slowed to 48.2 ml (68% of theoretical) and NMR showed a very weak amido-acid signal at 6.3-6.5 ppm. GC analysis showed 86.8% product. The reaction was cooled to room temperature and filtered to remove 71.8 g white solid. One-half of the solution, ~3500 ml, was loaded directly onto 1277 g silica gel. The initial 1000 ml eluent gave no product, but the 2nd 1000 ml, mainly xylenes, showed one spot on TLC (2.5% methanol/dichloromethane) and was rotary evaporated to give 60.7 g of product (A2). The silica gel was flushed with dichloromethane, giving three successive 1000 ml fractions (A3, A4, and A5 respectively) containing 150.2 g impure product. The remaining reactant solution, ~3500 ml in xylenes, was loaded onto 1273 g silica and flushed with recycled xylenes. The first three 1000 ml xylenes fractions (B1-B3) each showed one spot on TLC. The next 1000 ml fraction, B4, obtained with toluene as the eluent, gave one spot on TLC, but the next two 1000 ml toluene fractions (B5 and B6) showed weak levels of product in presence of other byproducts. Fractions A2, B1, B2, B3, and B4 were combined and rotary evaporated to give 223.6 g of an oil which crystallized on standing. This was 97.4% pure by GC. This was recrystallized from 150 ml hot heptane to yield 124.4 g at 99.9% purity. A second crop yielded 22.2 g at 99.7% purity.

Example M3

Unsubstituted Maleimide; Methylene—C1 Spaced

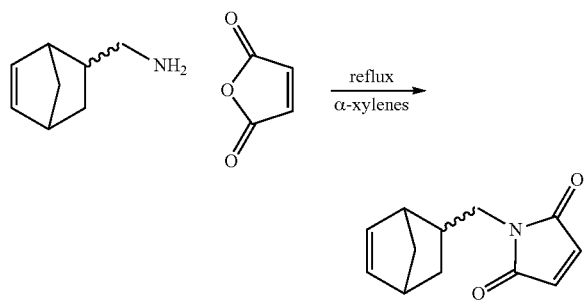

Endo-/exo-N—NBCH2maleimide (endo/exo-MINB). Maleic anhydride (117.0 g, 1.2 mol) was mixed with 860 ml o-xylene, causing the temperature to drop to 16.5° C., while yielding a hazy solution. Aminomethyl-norbornene (98% purity, 1.2 mol) was dissolved in 144 ml o-xylene and added dropwise over a 15-minute period to the stirred mixture, causing the temperature to rise to 64.6° C. A white slurry resulted. The mixture was mechanically stirred as the o-xylene was refluxed into a Dean-Stark trap for 5 hours. Water take-off stopped at 13.5 ml (64% of theoretical) after 4.5 hrs. TLC (2.5% methanol/dichloromethane) and NMR confirmed the presence of product and the absence of non-cyclized amido acid. The reaction was cooled to room temperature, filtered to remove precipitated white solids, and split into two 600 ml portions. Each portion was independently loaded onto 1000-1100 g of silica and flushed 6000 ml of dichloromethane. Rotary evaporation of the combined elutants gave 89.1 g crystalline product. This was recrystallized from 40 ml hot heptane to give 80.5 g product at 99.4% purity. NMR analysis showed the product contained as much as 5.7 mol % o-xylene. The crystals were rotary evaporated under high vacuum at 45° C. to remove the o-xylene, but subsequent NMR analysis revealed the presence of 1.8% maleic anhydride (this was masked by o-xylene in earlier analyses). The crystals were rotary evaporated again under high vacuum at 65-75° C. to give product showing <0.6 wt % maleic anhydride by NMR. GC analysis showed 99.4% purity and no detectable maleic anhydride. Yield was 77.2 g (32.5% yield), mp 69.1-71.3° C. (glasses at 66.1-68.6° C.).

Example M4

Exo-N—NBCH$_2$CH$_2$-2,3-dimethylmaleimide(exo-DMIENB)

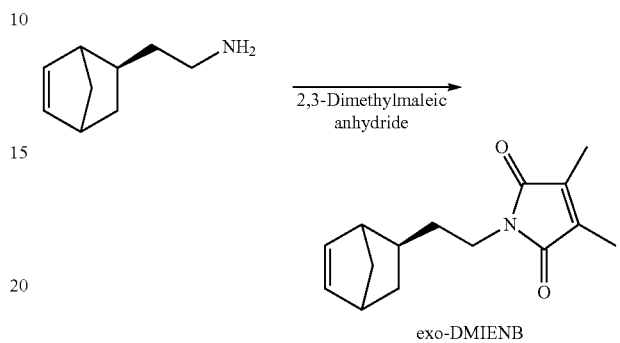

Dimethylmaleic anhydride (18.8 g, 0.15 mol) was dissolved in 120 ml toluene, causing the solution to cool to 18° C. Solid exo-(aminoethyl)norbornene (20.4 g, 0.15 mol) was mostly dissolved in hot toluene, although the mixture contained residual gel and solids on cooling. This was added to dimethylmaleic anhydride solution. Precipitation of white solids immediately occurred. The reaction mixture was mechanically stirred as the reaction was heated to reflux. At 102° C., reflux began and the solution cleared. After seventeen minutes the theoretical amount of water had been collected in the Dean-Stark trap. The reaction was heated an additional two hours at reflux and then cooled to 9° C. The mixture was filtered to remove solids and then rotary evaporated to yield 43.7 g. This was distilled in the Kugelrohr oven to collect 17.9 g (46% yield) at 175-185° C. (<1 mbar). GC analysis showed 99.0% purity.

Example M5

NBCH$_2$CH$_2$CH$_2$-2,3-dimethylmaleimide

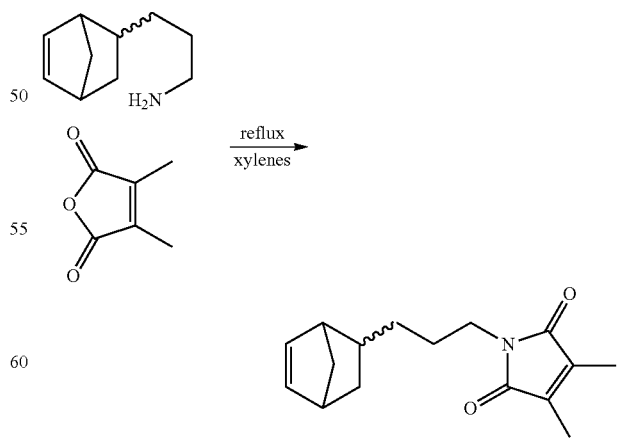

In a 500 mL round bottom flask, dimethyl maleic anhydride (42.6 g, 0.34 m) was dissolved in toluene (300 mL) at ambient temperature. The solution was placed under a blanket of nitrogen gas to exclude oxygen. The reaction flask was placed in an ice bath to prevent excessive heating from the exothermic reaction. Once the dimethyl maleic anhydride had dissolved, an addition funnel containing 5-norbornene-2-propylamine (50 g, 0.3 m) was attached and the norbornene compound was added to the reaction flask dropwise over a period of 3 hours. The addition funnel was removed and a dean stark trap and reflux condenser was attached to the flask. The solution was heated to reflux in an oil bath set at 125° C. and the reaction permitted to stir at temperature for 18 hour. Approximately 6 mL of water was collected in the dean stark trap during this time. The flask was removed from the oil bath and permitted to cool to ambient temperature. The toluene solvent was stripped using a rotovap resulting in a yellow oil. The crude product was applied to a flash chromatography column (250 g of silica gel) and eluted with 1.7 liters of cyclohexane/ethyl acetate (95/5 weight) solvent mixture. The elution solvent was stripped using a rotovap and then dried under vacuum at 45° C. for 18 hours to yield 79.5 g (92.7% yield) of the desired product.

Example A1

Formula (F)

A 500 ml round bottom flask was charged with 5-hydroxymethyl norbornene (13.6 g, 0.11 mol), 3-(3,5-di-tert-butyl-4-hydroxyphenyl)propionic acid methyl ester (29.2 g, 0.1 mol), and 250 mL of xylene. The flask was sealed with a rubber septum and the organic solution was degassed by bubbling with nitrogen gas for 15 minutes. Di-octyl tin oxide (0.58 g, 0.0016 mol) was added to the round bottom flask. A dean stark trap and a reflux condenser were attached and the apparatus was sealed with a rubber septum. The flask was placed under a nitrogen blanket. The reaction flask was placed into an oil bath heated at 145° C. and the solution was heated to a gentle reflux. The reaction solution was stirred at reflux for 18 hours, during which time approximately 2.9 mL of methanol was collected in the dean stark trap. The reaction flask was removed from the oil bath and allowed to cool to ambient temperature. The xylene was stripped off under reduced pressure using a rotovap leaving a viscous orange oil which hardened to a solid upon cooling to ambient temperature. The crude product was purified by dissolving the solid mass in cyclohexane and passing the resulting liquid through a silica column (200 g of silica gel). 30.0 g (78% yield) of a viscous colorless oil was isolated from the column after removal of the cyclohexane eluent.

Example A2

Formula (F)

A 500 ml round bottom flask was charged with 5-hydroxymethyl norbornene (52.2 g, 0.4 mol), 3-(3,5-di-tert-butyl-4-hydroxyphenyl)propionic acid methyl ester (117 g, 0.4 mol), and 250 mL of xylene. The flask was sealed with a rubber septum and the organic solution was degassed by bubbling with nitrogen gas for 15 minutes. Di-octyl tin oxide (2.3 g, 0.006 mol) was added to the round bottom flask. A dean stark trap and a reflux condenser were attached and the apparatus was sealed with a rubber septum. The flask was placed under a nitrogen blanket. The reaction flask was placed into an oil bath heated at 145° C. and the solution was heated to a gentle reflux. The reaction solution was stirred at reflux for 18 hours, during which time methanol was collected in the dean stark trap. The reaction flask was removed from the oil bath and allowed to cool to ambient temperature. The xylene was stripped off under reduced pressure using a rotovap leaving a viscous orange oil which hardened to a solid upon cooling to ambient temperature. The crude product was purified by dissolving the solid mass in cyclohexane and passing the resulting liquid through a silica column (200 g of silica gel). A 68% yield of a viscous colorless oil was isolated from the column after removal of the cyclohexane eluent.

Polymer Examples

Example P1

Copolymerization of NBMI Monomers with Decyl NB Using Pd Catalysis

The objective of these Examples was to study the copolymerization NBMI-C-1, NBMI-C-2 with decyl NB at different catalyst ratios, different solvents at varying temperatures using DCE as solvent.

Reaction Schemes:

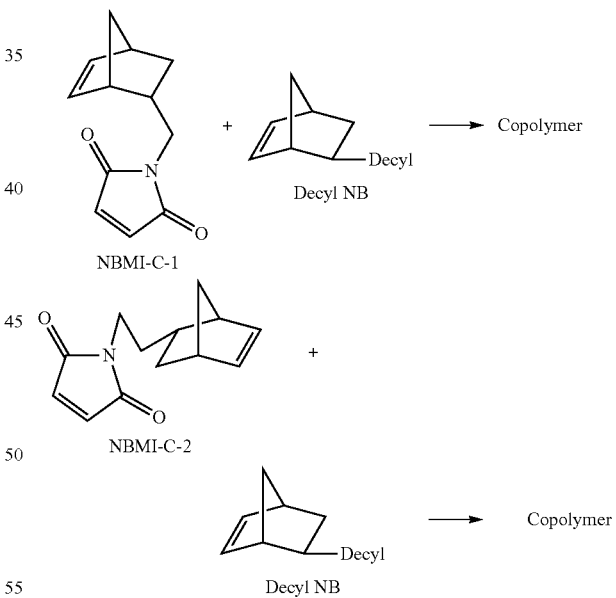

| Reaction Conditions: | | |
|---|---|---|
| Monomers: | Norbornene Maleimides (NBMI-C-1 & NBMI-C-2) | 50 mol % |
|  | Decyl Norbornene (Decyl NB) | 50 mol % |
| Catalysts: | Allyl Pd Chloride dimer | (0.001 m, 1 eqv) |
|  | AgSbF$_6$ | (0.001 m, 3 eqv) |
|  | DCE (dichloroethane) | (10 gms, 8 ml) |

-continued

| Catalysts Ratios: | 200/1 & 500/1 | | | | |
| --- | --- | --- | --- | --- | --- |
| Temperatures: | 25° C. & 50° C. | | | | |
| Time: | 48 hrs. | | | | |

| Catalyst Components | Molar eqv | Mol. wt. | Moles | Grams | Density (g/ml) |
| --- | --- | --- | --- | --- | --- |
| Allyl Pd chloride dimer | 1 | 365.9 | 0.001 | 0.4 | |
| AgSbF$_6$ | 3 | 343.6 | 0.003 | 1.03 | |
| DCE | | | | 10 (8 ml) | 1.3 |
| Toluene | | | | 10 (11.5 ml) | 0.9 |

| Monomers | Mol. wt. | Mol. Form. | Moles | mole % | Grams | Density (g/ml) |
| --- | --- | --- | --- | --- | --- | --- |
| NBMI-C-1 | 203.2 | C$_{12}$H$_{13}$NO$_2$ | 0.01 m | 50 | 2.0 g | |
| Decyl NB | 234.4 | C$_{17}$H$_{30}$ | 0.01 m | 50 | 2.3 g | |
| NBMI-C-2 | 217.3 | C$_{13}$H$_{15}$NO$_2$ | 0.01 m | 50 | 2.9 g | |
| Decyl NB | 234.4 | C$_{17}$H$_{30}$ | 0.01 m | 50 | 2.3 g | |
| DCE | | | | | 17.6 (14 ml) | |

Procedure

In a 50 ml septum vial equipped with stir bar the flask was charged with NBMI-1 (2.0 g, 0.001 mols) and Decyl NB (2.4 g, 0.001 mols) monomers and DCE solvent. The vials are capped and removed from glove box.

In a 25 ml septum vial equipped with stir bar the solvent was weighed first and then both the catalysts are weighed and transferred into the vial. There did not appear to be an effect based on the order of addition of the solids. The catalyst solution was stirred at moderate temperature in glove box for 1 hr. A very fine solid formed in the DCE solution after 1 hr of stirring. This is precipitated AgCl and it will never dissolve. The solid was filtered out of the solution using 0.2 micron syringe filter in the glove box and transferred into another 25 ml septum vial. The catalyst solution can then be removed from the glove box and is ready to use.

The reaction bottles and catalyst bottles with sure seals were removed from the dry box and catalyst was injected at room temperature while they are stirring. The reaction mixture turned a yellow color after the catalyst addition. The vials were left for stirring for 48 hrs.

The polymerization gradually become viscous yellow, and then by 48 hrs become black as Pd started degrading. The polymer mixture after termination of reaction was diluted with 45 ml THF and stirred for 1 hr. The polymer solution was then added dropwise to an excess of methanol (500 ml) in order to precipitate the polymer. The grey, solid polymer was recovered by filtration and dried under vacuum at 25° C. for 24 hrs. 2.70 g of dry poly (60.64% yield was recovered and submitted for GPC analysis. The polymer was found to have Mn=8400; Mw=66,224; PDI=7.9.

| Sample No. | Monomers (50/50) | Temp. (° C.) | Time (Hours) | Catalyst Ratio | Solvent | GPC | % Yield |
| --- | --- | --- | --- | --- | --- | --- | --- |
| 1 | NBMI-C-1/ Decyl NB | 25 | 48 | 200/1 | Dichloro Ethane | Mn: 8400 Mw: 66224 PDI: 7.9 | 60.6 |
| 2 | NBMI-C-1/ Decyl NB | 25 | 48 | 500/1 | Dichloro Ethane | Mn: 21450 Mw: 92309 PDI: 4.3 | 48.3 |
| 3 | NBMI-C-1/ Decyl NB | 50 | 48 | 200/1 | Dichloro Ethane | Mn: 9127 Mw: 39369 PDI: 4.3 | 70 |
| 4 | NBMI-C-1/ Decyl NB | 50 | 48 | 500/1 | Dichloro Ethane | Mn: 14911 Mw: 53011 PDI: 3.6 | 56 |
| 5 | NBMI-C-1/ Decyl NB | 50 | 48 | 200/1 | Toluene | Mn: 5227 Mw: 3508 PDI: 1.1 | 14 |
| 6 | NBMI-C-2/ Decyl NB | 25 | 48 | 200/1 | Dichloro Ethane | Mn: 12375 Mw: 110166 PDI: 8.9 | 45 |
| 7 | NBMI-C-2/ Decyl NB | 25 | 48 | 500/1 | Dichloro Ethane | Mn: 54600 Mw: 390814 PDI: 7.2 | 77 |
| 8 | NBMI-C-2/ Decyl NB | 50 | 48 | 200/1 | Dichloro Ethane | Mn: 12477 Mw: 76304 PDI: 6.1 | 87.8 |
| 9 | NBMI-C-2/ Decyl NB | 50 | 48 | 500/1 | Dichloro Ethane | Mn: 18541 Mw: 73085 PDI: 3.9 | 52.4 |

-continued

| Sample No. | Monomers (50/50) | Temp. (° C.) | Time (Hours) | Catalyst Ratio | Solvent | GPC | % Yield |
|---|---|---|---|---|---|---|---|
| 10 | NBMI-C-2/ Decyl NB | 50 | 48 | 200/1 | Toluene | Mn: 3628 Mw: 5831 PDI: 1.6 | 1 |
| 11 | NBMI-C-2/ Decyl NB | 50 | 48 | 500/1 | Toluene | Mn: 3083 Mw: 4925 PDI: 1.6 | 5.9 |

Example P2

This Example was to illustrate the thermal oxidative stability for the polymers of the invention both with and without an antioxidant.

The polymers used in this Example comprised (mol/mol) 50% decyl NB, 20% phenyl ethyl NB, and 30% NB dimethyl maleimide (methyl spaced). The polymers had a GPC molecular weight of Mw=110545 and Mn 45319. The polymer was dissolved on a 2-heptanone solvent (33% total polymer) and used to make two formulations. Each formulation had 5 g of the polymer, 10 g of 2-heptanone, 0.3 gram 1-chloro-4-propoxy-9H-thioxanthen-9-one (5 part per hundred based on polymer solid), and 0.3 g 3-aminopropyl silane (at 5 part per hundred based on polymer solid). However, formula 2 also contained 0.1 g of an antioxidant (Irganox 1076).

Figure 3:
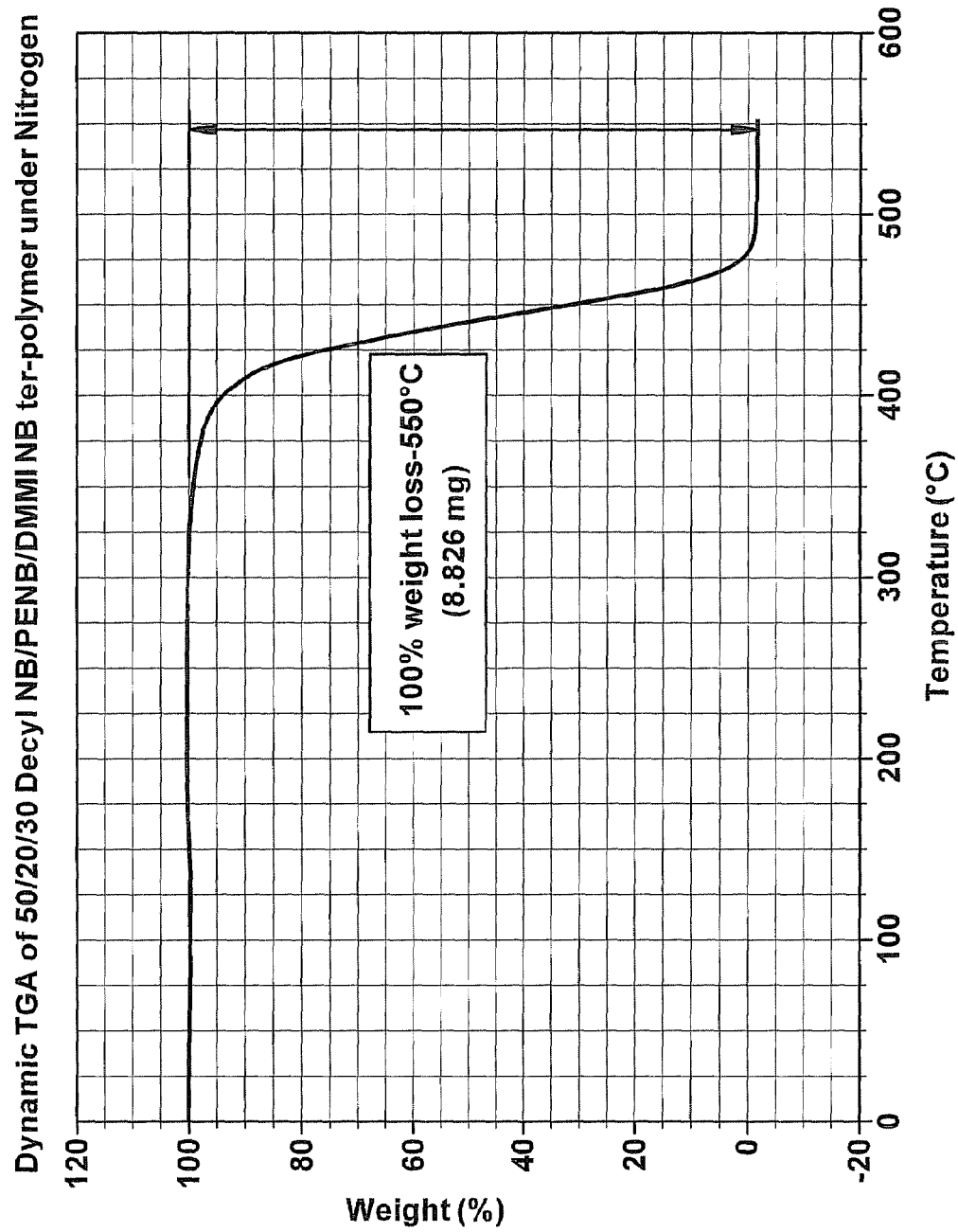
FIG. 3 is a Dynamic TGA of the polymer of Example P12.

The formulations were spin coated onto round quartz disks to a thickness of 11.5 μm and baked for 120° C. for 5 minutes. An initial UV-VIS transmission scan was performed. The coated samples were then placed into an air atmosphere convection oven at 150° C. for 7 days. After which, a final UV-VIS transmission scan was performed. The results of this experiment are shown in FIG. 1. Further results are shown in FIG. 3, which shows the dynamic TGA of the polymer under nitrogen.

Examples P3-P9

The generic procedure for making the seven polymers (P3 to P9) is as follows, with amounts that vary in the Table below. A 500 mL septum vial and magnetic stirring bar were dried in an air oven at 115° C. for 24 hours. The vial was removed from the oven, capped with a septum, placed under a nitrogen blanket and allowed to cool to ambient temperature. Using a cannula, anhydrous toluene (221 mL), anhydrous Ethyl acetate (39 mL), decyl norbornene (36.1 g, 0.2 m), and the norbornene of Formula F (A NB) (20.0 g, 0.08 m) were added to the vial. The solution was then degassed with nitrogen gas for 15 minutes. In the glove box, a 25 mL septum vial was charged with the NiArF catalyst (2.8 g, 0.006 m) and toluene (28.3 g). The toluene solution was stirred for 60 minutes to completely dissolve the catalyst. The vial was then removed from the glove box and the catalyst was transferred into the reaction vial using a cannula over a period of 3 minutes. The polymerization reaction solution was stirred at ambient temperature for 3 hours and then quenched by pouring the viscous solution into a 1 L beaker containing 250 mL of THF. A mixture of glacial acetic acid (54 g), aqueous hydrogen peroxide (105 mL) and de-ionized water (200 g) was added to the beaker and the 2-phase solution was stirred vigorously for 6 hours. The stirring was stopped and the 2 phases were permitted to separate. The aqueous phase was discarded and the organic phase was washed 3 times with 300 mL of de-ionized water. The polymer was then recovered by precipitating into an excess of methanol (4 L). The recovered solid polymer was dried under vacuum at 65° C. for 18 hours, 82.3 g (95% yield) of the polymer was obtained. The polymer composition molecular weight was measured by GPC.

| Polymer | | | $^1$H NMR | Molecular weight | |
|---|---|---|---|---|---|
| ID | Monomer composition | Yld | composition | Mw | PDI |
| P3 | A NB/Decyl NB (30/70) | 96% | 28.5%/71.5% | 81,240 | 2.3 |
| P4 | A NB/Decyl NB (20/80) | 91% | 20.6%/79.4% | 110,321 | 2.7 |
| P5 | A NB/Decyl NB (10/90) | 93% | 11.3%/88.7% | 113,952 | 3.0 |
| P6 | A NB/Decyl NB/ DMMINB (40/30/30) | 90% | 35%/34%/31% | 94,404 | 2.4 |
| P7 | A NB/Decyl NB/ DMMINB (20/50/30) | 92% | 21%/48%/31% | 102,786 | 2.8 |
| P8 | A NB/Decyl NB/ DMMINB (40/30/30) | 94% | 37%/35%/27% | 108,369 | 2.5 |
| P9 | A NB/Decyl NB/C3 DMMINB (30/50/20) | 93% | 30%/50%/20% | 83,968 | 2.4 |

Figure 4:
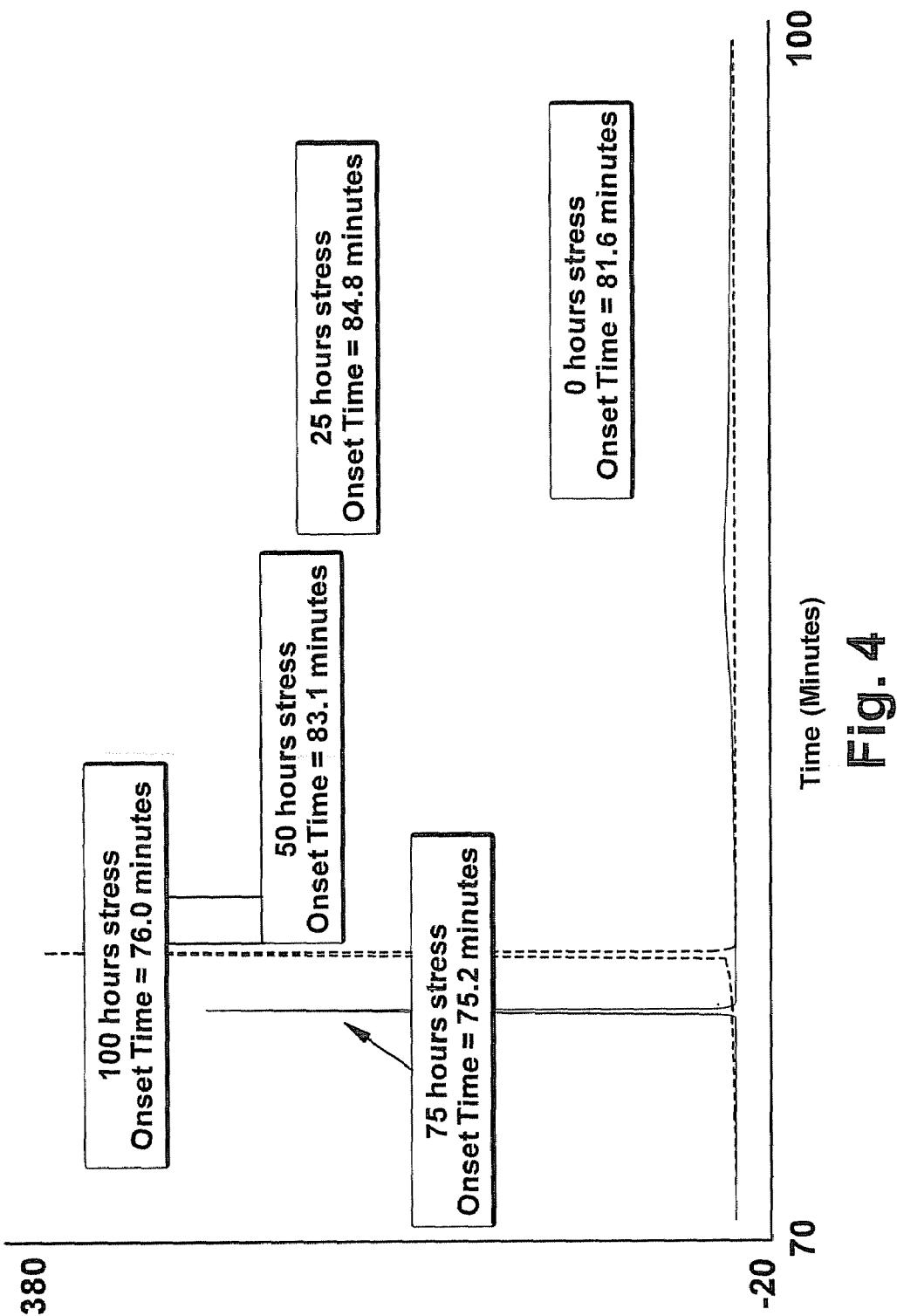
FIG. 4 is a graph of the oxidation induction time for the polymer of Example P7 below.
Figure 5:
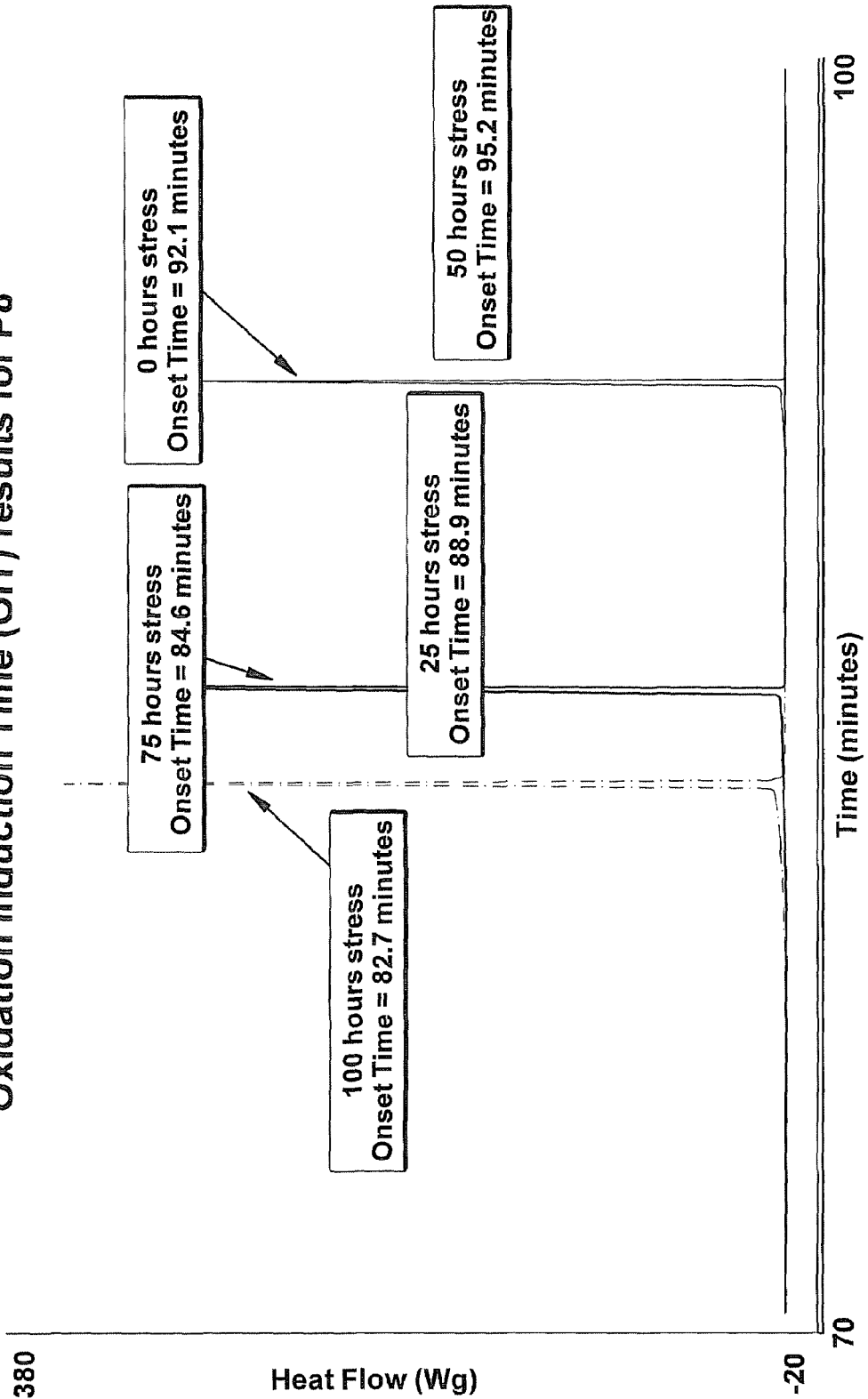
FIG. 5 is a graph of the oxidation induction time for the polymer of Example P8 below.

The oxidation induction time (OIT) for Example P7 is shown in FIG. 4 while the OIT for Example P8 is shown FIG. 5.

The thermo-oxidative stabilities of polymers P7, P8, and P9 were evaluated using a test called oxidation induction time. This is a differential scanning calorimetry (DSC) method named oxidation induction time. A milligram scale sample of a polymer film is exposed to a pure oxygen (99.999%) atmosphere at an elevated temperature. 190° C. was used for testing the polymers. The onset of oxidation is considered to be when an exothermic (heat emitting) reaction is observed by the DSC.

| Sample | Onset (min) | Peak (min) | Peak Height (W/g) |
|---|---|---|---|
| P7 (0H) | 81.6 | 87.1 | 5.1 |
| P7 (25H) | 84.8 | 84.9 | 342.7 |
| P7 (50H) | 83.1 | 83.5 | 354.8 |
| P7 (75H) | 75.2 | 75.2 | 270.4 |
| P7 (100H) | 76.0 | 76.7 | 289.7 |
| P8 (0H) | 92.1 | 92.4 | 283.9 |
| P8 (25H) | 88.9 | 89.5 | 342.0 |
| P8 (50H) | 95.2 | 95.2 | 315.1 |
| P8 (75H) | 84.6 | 84.9 | 292.2 |
| P8 (100H) | 82.7 | 82.7 | 339.8 |
| P9 (0H) | 70.4 | 98.0 | 1.1 |
| P9 (25H) | 66.3 | 91.1 | 1.0 |
| P9 (50H) | 63.6 | 89.9 | 1.2 |
| P9 (75H) | 55.3 | 77.4 | 1.3 |
| P9 (100H) | 51.3 | 75.6 | 1.3 |

Example P10

In a 250 ml glass Buchi reactor equipped with a magnetic stir bar the flask was charged with NBMI-2 (2.2 g, 0.01 mol) and Decyl NB (21.1 g, 0.09 mol) monomers, dimethylanilinium [tetrakis(pentafluorophenyl)borate] (0.048 g, 0.06 mmol) and toluene solvent (60 mL). The reactor was capped and the monomer solution was sparged with nitrogen gas for 30 minutes. In a 10 ml septum vial equipped with stir bar the toluene solvent (2.8 g) was weighed first and then both the catalyst was weighed [Pd 708 (0.01 g; 0.02 mmol)] and transferred into the vial. The catalyst solution was stirred at moderate temperature in glove box for 1 hr in order to dissolve it completely.

The septum vial was removed from the dry box and catalyst was injected into the Buchi reactor at 80° C. while the solution was mixing. The reaction mixture turned a yellow color after the catalyst addition, stirring was continued for 17 hrs during which time the reaction mixture gradually become more viscous and by 17 hrs become black as Pd from the catalyst began degrading. Then the reaction mixture was diluted with 45 ml THF and stirred for an additional 1 hr. Then the polymer was caused to percipitate by adding the reaction mixture dropwise to an excess of methanol (500 ml). A grey, solid polymer was recovered by filtration and dried under vacuum at 25° C. for 24 hrs. 21.4 g of dry polymer (92% yield) was recovered and submitted for GPC analysis. The polymer was found to have Mn=17,519; Mw=76,559; PDI=4.37. Composition by $^1$H NMR 91 mole % Decyl NB and 9 mole % MI-C-2 NB.

Example P11

A 500 ml glass Wheaton bottle equipped with a magnetic stir bar was charged with DMMI NB (34.7 g, 0.2 mol) and Decyl NB (35.1 g, 0.2 mol) monomers, and toluene solvent (200 mL). The bottle was capped and the monomer solution was sparged with nitrogen for 30 minutes. In a 10 ml septum vial equipped with stir bar toluene solvent (6.7 g) NiArF catalyst (0.7 g; 1.4 mmol)] were weighed and transferred into the vial. The catalyst and toluene were stirred at moderate temperature in glove box for 1 hr in order to completely dissolve the catalyst The catalyst bottle was removed from the dry box and catalyst was injected into the Wheaton bottle at 45° C. while the solution was mixing. The reaction mixture turned a red color after the catalyst addition and stirring was continued for an additional 2 hrs during which time the reaction mixture gradually become viscous and then become black as catalyst started degrading. The reaction mixture was then diluted with 45 ml THF and stirred for an additional 1 hr. Any residual catalyst was removed by intimately mixing the polymer solution with a mixture of glacial acetic acid (25 g), aqueous hydrogen peroxide [37 weight %] (50 g) and deionized water (100 g) for 5 hours at 50° C. The reaction mixture was then washed 3 times with dionized water (DI) water (100 g) and then added dropwise to an excess of methanol (500 ml) in order to precipitate the polymer. A white, solid polymer was recovered by filtration and dried under vacuum at 25° C. for 24 hrs. 58.6 g of dry polymer (84% yield) was recovered and submitted for GPC analysis. The polymer was found to have Mn=56,217; Mw=100,067; PDI=1.78. Composition by $^1$H NMR 52 mole % Decyl NB and 48 mole % DMMI NB.

Example P12

A 500 ml glass Wheaton bottle equipped with a magnetic stir bar was charged with PENB (18.1 g 0.077 mol) DMMI NB (15.8 g, 0.068 mol) and Decyl NB (16.06 g, 0.0.068 mol) monomers, and Toluene solvent (150 mL). The bottle was capped and the monomer solution was sparged with nitrogen gas for 30 minutes. Toluene solvent (6.2 g) and NiArF catalyst (0.9 g; 1.6 mmol) were weighed and transferred into a 10 ml septum vial equipped with stir bar. The catalyst solution was stirred for 1 hr to completely dissolve the catalyst.

The catalyst bottle was removed from the dry box and catalyst was injected into the reaction bottle at 30° C. while the solution was mixing. The reaction mixture turned a red color after the catalyst addition. The temperature of the reaction was increased to 50° C. during the first 30 minutes of the reaction and maintained at temperature for an additional 4 hours with continued stirring during which time the reaction mixture gradually became viscous and by 4 hrs became black as the catalyst started degrading. The reaction mixture was then diluted with 45 ml THF and stirred for an additional 1 hr. Any residual catalyst was removed by intimately mixing the reaction mixture with a mixture of glacial acetic acid (20.0 g), aqueous hydrogen peroxide [37 weight %] (37.6 g) and deionized water (20 g) for 5.5 hours at 50° C. After which it was washed 3 times with D.I water (100 g) and then added dropwise to an excess of methanol (500 ml) in order to precipitate the polymer. A white, solid polymer was recovered by filtration and dried under vacuum at 25° C. for 24 hrs. 58.6 g of dry polymer (84% yield was recovered and submitted for GPC analysis. The polymer was found to have Mn=35,535; Mw=59,361; PDI=1.67. Composition by $^1$H NMR 41 mole % PENB, 29 mole % Decyl NB and 30 mole % DMMI NB.

Example P13

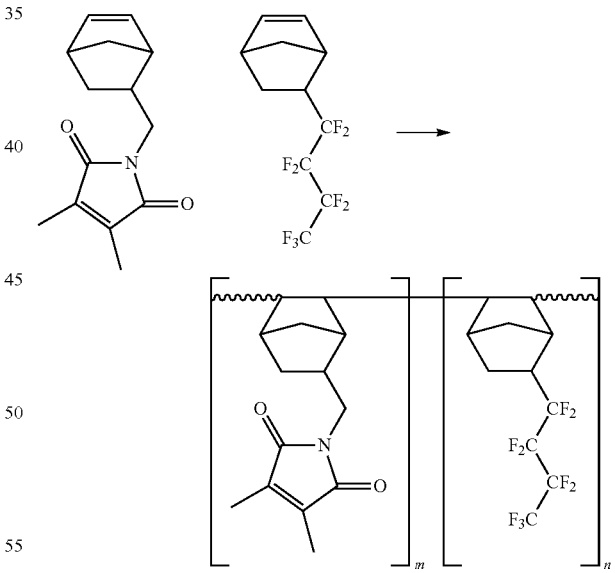

A monomer mixture of DMMINB (8.51 g, 37.0 mmol), 5-nonafluorobutyl norbornene (NBC$_4$F$_9$, 11.49 g, 37.0 mmol) and toluene (60.0 g) was added to and mixed in a 250 mL crimp-cap vial. The mixture was sparged with nitrogen and sealed. NiArF catalyst (0.36 g, 0.74 mmol) mixed with toluene (3.6 g) and ethyl acetate (0.4 g) were added to a 10 mL crimp-cap vial inside a dry-box and sealed. The catalyst solution was added to the monomer mixture at ambient temperature with rapidly stirring which was continued for 3 hours after which the reaction bottle opened to air and 1-2 mL of Di water added. A mixture of DI water (17.0 g), 30% aqueous hydrogen peroxide (11.0 g) and glacial acetic acid (6.0 g) added to the reaction mixture to remove any residual catalyst, the vial sealed and stirred at ambient temperature for an additional 15 hours. Then the reaction mixture was removed from the aqueous phase and washed five times with a mixture of DI water (75 g) and 2-propanol (25 g). The pH of the aqueous washes was monitored during these washings to ensure the final wash had a pH value greater than 5. The resulting polymer solution was diluted with tetrahydrofuran (50 g) and precipitated into rapidly stirring methanol (1.0-1.5 L). After removing the precipitated polymer by filtration, it was dried overnight at 70-80° C. in a vacuum oven to yield 13.0 g (65.0%) of colorless solid. The polymer composition was found to be 50 mol % DMMI NB and 50 mol % 5-nonafluorobutyl norbornene by $^1$H-NMR. Molecular weight as measured by GPC was Mn=38,433, Mw=84,937, PDI=2.21.

Example P14

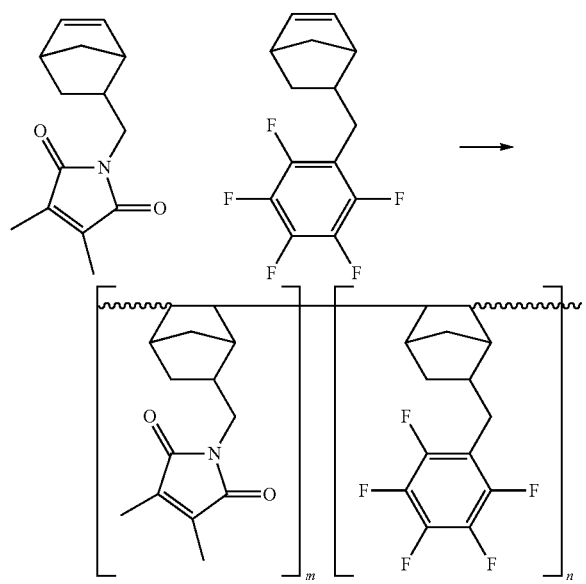

A monomer mixture of DMMINB (9.2 g, 40.0 mmol), 5-pentafluorobenzyl norbornene (NBCH$_2$C$_6$F$_5$, 10.8 g, 40.0 mmol) and toluene (60.0 g) was added to and mixed in a 250 mL crimp-cap vial. The mixture was sparged with nitrogen and sealed. NiArF catalyst (0.4 g, 0.8 mmol) mixed with toluene (3.6 g) and ethyl acetate (0.4 g) were added to a 10 mL crimp-cap vial inside a dry-box and sealed. The catalyst solution was added to the monomer mixture at ambient temperature with rapidly stirring which was continued for 2 hours after which the reaction bottle opened to air and 1-2 mL of DI water added. A mixture of DI water (17.0 g), 30% aqueous hydrogen peroxide (11.0 g) and glacial acetic acid (6.0 g) added to the reaction mixture to remove any residual catalyst, the vial sealed and stirred at ambient temperature for an additional 15 hours. Then the reaction mixture was removed from the aqueous phase and washed five times with a mixture of DI water (75 g) and 2-propanol (25 g). The pH of the aqueous washes was monitored during these washings to ensure the final wash had a pH value greater than 5. The resulting polymer solution was diluted with tetrahydrofuran (50 g) and precipitated into rapidly stirring methanol (1.0-1.5 L). After removing the precipitated polymer by filtration, it was dried overnight at 70-80° C. in a vacuum oven to yield 16.0 g (80% yield) of colorless solid. The polymer composition was found to be 50 mole % DMMI NB and 50 mole % 5-pentafluorobenzyl norbornene by $^1$H-NMR. Molecular weight as measured by GPC was Mn=33,100, Mw=108,240, PDI=3.27.

Formulation and Process Example F1

An amber wide neck bottle was charged with 100.0 g of polymer material P7 and 10 g of 2-heptanone. The solution was mixed until the solid polymer was completely dissolved and then filtered through a 1.0 micron filter to remove particles. To the solution was added 5.0 g (0.02 mol) of Speedcure® CTPX (Lambson Group Ltd.) and 1.50 g of Irganox 1076 (3.0 mmol). The solution is mixed for 18 hours to completely disperse the photoactive compounds.

A 5 inch silicon dioxide (625 thick thermal oxide coating) wafer is spin coated with 4.0 g of the polymer solution. The resulting coating is soft baked by heating at 120° C. on a hot plate for 5 minutes. The film is patterned by exposing it imagewise to 800 mJ/cm$^2$ of 365 nm (I line) radiation through a chrome plated glass mask. The resulting pattern in the polymer film is enhanced by heating the wafer on a hot plate at 90° C. for 4 minutes. The pattern is developed by spraying the film with 2-heptanone for 25 seconds to dissolve the unexposed regions of the film. The wet film is then rinsed with PGMEA for 15 seconds. The film is dried by placing it on a hot plate at 90° C. for 5 minutes.

Formulation and Process Example F2

Formulation: An amber wide neck bottle was charged with 100.0 g of polymer material P7 and 100.0 g of 2-heptanone. The solution was mixed until the solid polymer was completely dissolved and then filtered through a 0.4 micron filter to remove particles. To the solution was added 5.02 g (0.02 mol) of Speedcure® CTPX (Lambson Group Ltd.), 5.02 g (0.02 mol) of Si 75 (Gelest Inc.) and 1.5 g (3.0 mmol) of Irganox 1076 (Ciba). The solution was mixed for 18 hours to completely disperse the photoactive compounds.

Processing: A 5 inch silicon dioxide wafer is spin coated with 4.0 g of the polymer solution. The resulting coating is soft baked by heating at 120° C. on a hot plate for 5 minutes. The film is patterned by exposing it imagewise to 900 mJ/cm$^2$ of 365 nm (I line) radiation through a chrome plated glass mask. The resulting pattern in the polymer film is enhanced by heating the wafer in a nitrogen oven at 90° C. for 4 minutes. The pattern is developed by spraying the film with 2-heptanone for 20 seconds to dissolve the unexposed regions of the film. The wet film is then rinsed with PGMEA for 15 seconds. The film is dried by placing it on a hot plate at 90° C. for 5 minutes.

With respect to any figure or numerical range for a given characteristic, a figure or a parameter from one range may be combined with another figure or a parameter from a different range for the same characteristic to generate a numerical range.

While the invention has been explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. A polymer comprising a first type and a second type of repeat unit represented by Formula I:

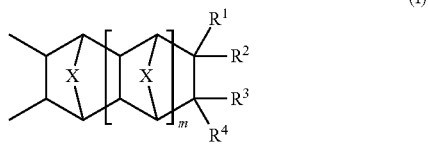

where X is selected from —CH$_2$—, —CH$_2$—CH$_2$—, or —O—; m is an integer from 0 to 5; and where for the first type of repeat unit one of R$^1$, R$^2$, R$^3$, and R$^4$ is a maleimide containing group represented by Formula II:

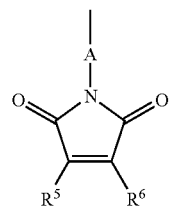

where A is a linking group selected from methylene, a linear or branched C$_2$ to C$_6$ hydrocarbyl, halohydrocarbyl or perhalocarbyl, or a substituted or unsubstituted C$_5$ to C$_{12}$ cyclic or polycyclic hydrocarbyl, halohydrocarbyl or perhalocarbyl, and R$^5$ and R$^6$ are each independently selected from H, methyl, ethyl, or n-propyl, and where the others of R$^1$, R$^2$, R$^3$, and R$^4$ are selected from H, a linear or branched C$_1$ to C$_{25}$ hydrocarbyl, halohydrocarbyl or perhalocarbyl;

and where for the second type of repeat unit one of R$^1$, R$^2$, R$^3$, and R$^4$ is a hindered aromatic group represented by Formula (D)

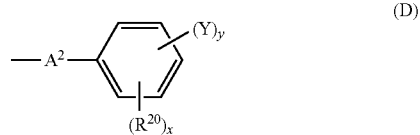

where A$^2$ is a linking group selected from methylene, a linear or branched C$_2$ to C$_6$ hydrocarbyl, halohydrocarbyl or perhalocarbyl, or a substituted or unsubstituted C$_5$ to C$_{12}$ cyclic or polycyclic hydrocarbyl, halohydrocarbyl or perhalocarbyl, C$_2$ to C$_{12}$ ester, C$_1$ to C$_{12}$ amide, C$_1$ to C$_{12}$ sulfide, or a combination thereof; each Y is independently a functional group such as OH and SH; y is an integer from 1 to about 3; each R$^{20}$ is independently a C$_1$ to C$_{12}$ alkyl (straight or branched) or cycloalkyl group (substituted or unsubstituted); and x is an integer from 1 to about 4;

a C$_8$ or greater alkyl group;

a C$_4$ or greater halohydrocarbyl or perhalocarbyl group;

a C$_7$ or greater aralkyl group; or a heteroatom hydrocarbyl or halohydrocarbyl group, with the proviso that the heteroatom hydrocarbyl or halohydrocarbyl group does not comprise an epoxy group.

2. The polymer of claim 1, wherein at least one of R$^5$ and R$^6$ is a methyl group.

3. The polymer of claim 1, further comprising a second type of repeat unit where X is selected from —CH$_2$—, —CH$_2$—CH$_2$—, or —O—; m is an integer from 0 to 5; and at least one of R$^1$, R$^2$, R$^2$ and R$^4$ is selected from a linear or branched C$_1$ to C$_{25}$ hydrocarbyl, halohydrocarbyl or perhalocarbyl, where such hydrocarbyl, halohydrocarbyl or perhalocarbyl comprises one or more heteroatoms selected from O, N, and Si, or a linear or branched C$_1$ to C$_{25}$ hydrocarbyl, halohydrocarbyl, or perhalocarbyl and the others of R$^1$, R$^2$, R$^2$ and R$^4$ are H.

4. The polymer of claim 3, where for the second type of repeat unit X is —CH$_2$—; m is 0; and at least one of R$^1$, R$^2$, R$^2$ and R$^4$ is selected from an aralkyl pendent group or a linear C$_1$ to C$_{25}$ hydrocarbyl, halohydrocarbyl, perhalocarbyl, and the others of R$^1$, R$^2$, R$^2$ and R$^4$ are H.

5. The polymer of claim 1, further comprising a third type of repeat unit where X is selected from —CH$_2$—, —CH$_2$—CH$_2$—, or —O—; m is an integer from 0 to 5; and at least one of R$^1$, R$^2$, R$^2$ and R$^4$ is selected from a linear or branched C$_1$ to C$_{25}$ hydrocarbyl, halohydrocarbyl or perhalocarbyl, where such hydrocarbyl, halohydrocarbyl or perhalocarbyl comprises one or more heteroatoms selected from O, N, and Si, or a linear or branched C$_1$ to C$_{25}$ hydrocarbyl, halohydrocarbyl, or perhalocarbyl and the others of R$^1$, R$^2$, R$^2$ and R$^4$ are H, with the proviso that said third type of repeat unit is distinct from said second type of repeat unit.

6. The polymer of claim 5, where for said third type of repeat unit X is —CH$_2$—; m is 0; and at least one of R$^1$, R$^2$, R$^2$ and R$^4$ is selected from an aralkyl pendent group or a linear C$_1$ to C$_{25}$ hydrocarbyl, halohydrocarbyl, perhalocarbyl, and the others of R$^1$, R$^2$, R$^2$ and R$^4$ are H.

7. The polymer of claim 1, where the amount of the first type of repeat unit ranges from 5 to 50 mole percent on a basis of total mole percent of the monomers from which the repeat units of the polymer are formed.

8. The polymer of claim 3, where the amount of the first type of repeat unit is 25 to 35 mole percent and the amount of the second type of repeat unit is 65 to 75 mole percent, on a basis of total mole percent of monomers from which said first and second types of repeat units are derived.

9. The polymer of claim 5, where the amount of the first type of repeat unit ranges from 10 to 50 mole percent, the amount of the second type of repeat unit ranges from 5 to 60 mole percent, and the amount of the third type of repeat unit ranges from 10 to 50 mole percent, on a basis of total mole percent of the monomers from which said first, second and third types of repeat units are derived.

10. The polymer of claim 9, wherein the amount of the first type of repeat unit is from 25 to 35 mole percent, the amount of the second type of repeat unit is from 35 to 45 mole percent.

11. The polymer of claim 1, where the weight average molecular weight (Mw) of the polymer is from about 10,000 to about 500,000 as determined by gel permeation chromatography using a poly(styrene) standard.

12. The polymer of claim 11, where after said polymer has completed a curing process, said polymer has a glass transition temperature of at least 250° C.

13. The polymer of claim 12, where said polymer has a moisture absorption of less than 2 weight percent and a dielectric constant of less than 3.9.

14. The polymer of claim 12, where said polymer has a modulus of from 0.1 GPa to 3 GPa.

15. The polymer of claim 1, further comprising a solvent selected from hydrocarbon solvents, aromatic solvents, cycloaliphatic cyclic ethers, cyclic ethers, acetates, esters, lactones, ketones, amides, cyclic carbonates, or mixtures thereof.

16. The polymer of claim 15, where the solvent is selected from cyclohexane, 2-heptanone, benzene, toluene, xylene, mesitylene, tetrahydrofuran, anisole, or terpenoids.

17. The polymer of claim 1, where $A^2$ comprises a $C_2$ to $C_{12}$ ester.

18. The polymer of claim 1, where y is 1, x is 2, Y is hydroxy, and each $R^{20}$ is independently a $C_1$ to $C_{12}$ alkyl.

19. The polymer of claim 1, where each $R^{20}$ is t-butyl.

20. The polymer of claim 1, where at least one $R^{20}$ is independently a cycloalkyl group.

21. The polymer of claim 1, where the hindered aromatic group represented by Formula (E)

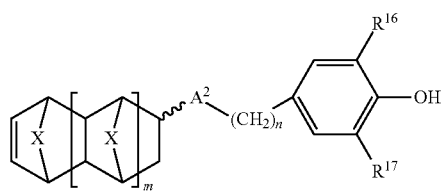

(E)

where X is selected from —$CH_2$—, —$CH_2$—$CH_2$—, or —O—; m is an integer from 0 to 3; $A^2$ is a linking group selected from methylene, a linear or branched $C_2$ to $C_6$ hydrocarbyl, halohydrocarbyl or perhalocarbyl, or a substituted or unsubstituted $C_5$ to $C_{12}$ cyclic or polycyclic hydrocarbyl, halohydrocarbyl or perhalocarbyl, $C_2$ to $C_{12}$ ester, $C_1$ to $C_{12}$ amide, $C_1$ to $C_{12}$ sulfide, or a combination thereof; n is an integer from 0 to about 5; and each of $R^{16}$ and $R^{17}$ is independently a $C_1$ to $C_{10}$ alkyl or a cycloalkyl group.

22. The polymer of claim 1, where the hindered aromatic group represented by Formula (F)

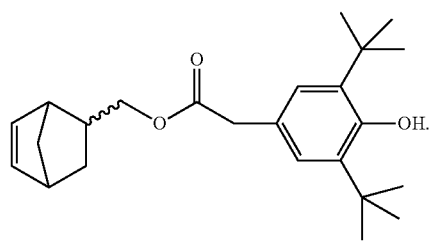

(F)

23. The polymer of claim 22, further comprising supplemental norbornene-type monomer with an antioxidant stabilizer pendent group is represented by Structure H below:

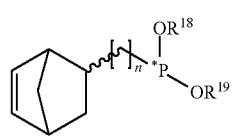

(H)

where n is an integer from 1 to about 5; and each of $R^{18}$ and $R^{19}$ are independently selected from a $C_1$ to $C_{25}$ hydrocarbyl group.

24. The polymer of claim 1, comprising a first type of repeat unit one of $R^1$, $R^2$, $R^3$, and $R^4$ is
1) a maleimide containing group represented by Formula II:

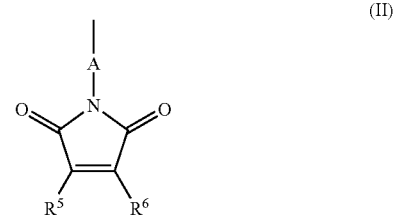

(II)

where A is a linking group selected from methylene, a linear or branched $C_2$ to $C_6$ hydrocarbyl, halohydrocarbyl or perhalocarbyl, or a substituted or unsubstituted $C_5$ to $C_{12}$ cyclic or polycyclic hydrocarbyl, halohydrocarbyl or perhalocarbyl, and $R^5$ and $R^6$ are each independently selected from H, methyl, ethyl, or n-propyl, and where the others of $R^1$, $R^2$, $R^3$, and $R^4$ are selected from H, a linear or branched $C_1$ to $C_{25}$ hydrocarbyl, halohydrocarbyl or perhalocarbyl;

and a second repeat unit one of $R^1$, $R^2$, $R^3$, and $R^4$ is a hindered aromatic group represented by Formula (D)

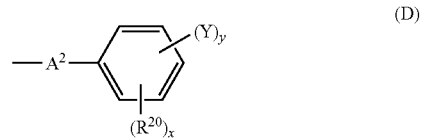

(D)

where $A^2$ is a linking group selected from methylene, a linear or branched $C_2$ to $C_6$ hydrocarbyl, halohydrocarbyl or perhalocarbyl, or a substituted or unsubstituted $C_5$ to $C_{12}$ cyclic or polycyclic hydrocarbyl, halohydrocarbyl or perhalocarbyl, $C_2$ to $C_{12}$ ester, $C_1$ to $C_{12}$ amide, $C_1$ to $C_{12}$ sulfide, or a combination thereof; each Y is independently a functional group such as OH and SH; y is an integer from 1 to about 3; each $R^{20}$ is independently a $C_1$ to $C_{12}$ alkyl (straight or branched) or cycloalkyl group (substituted or unsubstituted); and x is an integer from 1 to about 4.

25. The polymer of claim 1, further comprising a third type of repeat unit where one of $R^1$, $R^2$, $R^3$, and $R^4$ is a polyhedral oligomeric silsesquioxane group and the polymer has a Tg of at least about 200° C.

26. The polymer of claim 1, where one of $R^1$, $R^2$, $R^3$, and $R^4$ is a hindered aromatic group and the polymer has a thermo-oxidative stability where no significant change in mechanical properties is detected after a 50 hour exposure to air at 165° C.

27. A polymer comprising a first type of repeat unit derived from a norbornene-type monomer having a maleimide containing pendent group, a second type of repeat unit derived from a norbornene-type monomer having an aralkyl pendent group, and a third type of repeat unit derived from a norbornene-type monomer having a linear alkyl pendent group.

28. The polymer of claim 27, where the first type of repeat unit and the third type of repeat unit are each from between 25 to 35 percent of a total number of repeat units in the polymer and the second type of repeat unit is from between 35 to 45 percent of such total.

29. A photodefinable polymer composition comprising a polymer according to claim 1.

30. The photodefinable polymer composition of claim 29, further comprising components selected from: one or more sensitizer components, one or more solvents, one or more catalyst scavengers, one or more adhesion promoters, one or more antioxidants, one or more fire retardants, one or more stabilizers, one or more reactive diluents, or one or more plasticizers.

31. The photodefinable polymer composition of claim 30, where said one or more sensitizer components are selected from anthracenes, phenanthrenes, chrysenes, benzopyrenes, fluoranthenes, rubrenes, pyrenes, xanthones, indanthrenes, thioxanthen-9-ones, or mixtures thereof.

32. A microelectronic or micro-optoelectronic device comprising a layer formed from the photodefinable polymer composition of claim 29.

33. The microelectronic or micro-optoelectronic device of claim 32, where said device comprises semiconductor device elements, or optoelectronic device elements.

34. The microelectronic or micro-optoelectronic device of claim 32, where the device is selected from a logic chip, a passive device, a memory chip, a micro-electromechanical system (MEMS) chip, a micro-optoelectromechanical systems (MOEMS) chip, and an application specific integrated circuit (ASIC) chip.

35. The microelectronic or micro-optoelectronic device of claim 32, where said device comprises a semiconductor or optoelectronic device package.

36. A microelectronic or micro-optoelectronic device comprising a permanent dielectric structure formed from the photodefinable polymer composition of claim 29.

37. A microelectronic or micro-optoelectronic device comprising a layer formed from the photodefinable polymer composition of claim 29 as a barrier layer.

38. A microelectronic or micro-optoelectronic device comprising a layer formed from the photodefinable polymer composition of claim 29 as a stress buffer layer.

39. A method of forming a photodefinable layer on a substrate, the method comprising: coating at least a portion of one side of a substrate with the polymer of claim 1; exposing the coated polymer to actinic radiation; and curing the radiation-exposed coated polymer.

40. The method according to claim 39, further comprising defining a pattern in the cured polymer.

41. The method according to claim 40, where defining a pattern in the cured polymer comprises forming a plurality of structures from the cured layer.

42. The method according to claim 39, where the actinic radiation is ultraviolet or visible radiation having a wavelength from about 200 nm to about 700 nm.

43. The method according to claim 39, where the dose of actinic radiation for exposing is from about 50 to about 3,000 mJ/cm$^2$.

44. The method according to claim 39, where exposing comprises an imagewise exposure.

45. The method according to claim 39, where curing comprises heating to a temperature from about 150° C. to about 290° C. for a period between from about 30 to about 1800 minutes.

46. The method according to claim 39, wherein the coated polymer has a thickness from about 0.1 to about 100 microns.

47. The method according to claim 39, further comprising developing the exposed polymer prior to curing.

* * * * *